US006441513B1

(12) United States Patent
Mulhauser

(10) Patent No.: US 6,441,513 B1
(45) Date of Patent: Aug. 27, 2002

(54) METHOD AND APPARATUS FOR RAPID, SYNCHRONIZED, AND ISOLATED TRANSISTOR SWITCHING

(75) Inventor: Daniel F. Mulhauser, Windham, NH (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/548,963

(22) Filed: Apr. 13, 2000

(51) Int. Cl.$^7$ .............................................. H01H 35/00
(52) U.S. Cl. ...................................................... 307/130
(58) Field of Search ................................ 307/113, 116, 307/125, 130; 361/86, 91

(56) References Cited

U.S. PATENT DOCUMENTS

| | | | |
|---|---|---|---|
| 4,754,176 A | | 6/1988 | Jones et al. ................. 307/571 |
| 5,331,214 A | * | 7/1994 | Mori et al. ................. 307/116 |
| 5,455,795 A | * | 10/1995 | Nakao et al. ........... 365/189.05 |
| 5,781,040 A | | 7/1998 | Myers ......................... 307/571 |
| 5,809,406 A | * | 9/1998 | Taki et al. .................. 455/135 |
| 5,939,927 A | | 8/1999 | Myers ......................... 307/571 |
| 6,281,723 B1 | * | 8/2001 | Tailliet ....................... 327/143 |

* cited by examiner

Primary Examiner—Matthew Nguyen

(57) ABSTRACT

A switching circuit has switching devices, detector and driver circuits, and a transformer. Each detector and driver circuit detects when a control and driving signal present on the transformer secondary is in an "on" or "off" state and, responsive thereto, drives the switching device on or off, respectively, by applying to it the control and driving signal. A control and driving signal includes a voltage waveform across a secondary winding. The detector and driver circuit has on-threshold and off-threshold detectors that respectively detect that the control and driving signal is in "on" or "off" states when its voltage reaches on-threshold or off-threshold voltages. Driver circuits drive the switching devices on or off responsive to the on-threshold or off-threshold detectors, respectively. A controller applies to a primary driven winding a first set of voltages, thereby generating (i) a first current in the primary driven winding, (ii) a first magnetic field having a first quantum of energy, and (iii) a magnetically induced second set of voltages in the secondary winding. The controller interrupts the first current, thereby causing the first magnetic field to collapse, and, not later than interrupting the first current, clamps the primary driven winding to a third set of voltages, thereby magnetically inducing a fourth set of voltages in the secondary winding. At least one of the fourth set of voltages is less than at least one of the second set of voltages. The control and driving signal includes the second and fourth sets of voltages.

46 Claims, 8 Drawing Sheets

US 6,441,513 B1

METHOD AND APPARATUS FOR RAPID, SYNCHRONIZED, AND ISOLATED TRANSISTOR SWITCHING

RELATED APPLICATION

The following application is related to the present application: U.S. patent application Ser. No. 09/549,422 entitled "METHOD AND APPARATUS FOR ASYMMETRICALLY INDUCING VOLTAGES IN TRANSFORMER SECONDARY WINDINGS WHILE AVOIDING SUTARATION OF THE TRANSFORMER CORE," naming Daniel F. Mulhauser, as the inventor, assigned to the assignee of the present invention, and filed concurrently herewith.

FIELD OF THE INVENTION

The present invention relates generally to switching circuits and, more particularly, to circuits that may be used for switching transistors at high frequencies and high voltages.

BACKGROUND

Switching circuits have been designed for applications in which switching devices must stand off and supply high voltages, and in which rapid switching (e.g, in the range of microseconds or faster) is required. One of these applications, connecting a traveling wave tube to its high voltage cathode supply, is described in U.S. Pat. No. 4,754,176 to Jones, et al. As noted in Jones, switching transistors are preferred in these applications, as compared, for example, to mechanical relays, due to the requirements for rapid switching. In addition, it may be desirable to employ a number of switching transistors in series in order to overcome limitations on the amount of voltage that a single device can handle. Connecting the switching transistors in series typically imposes the additional requirements that the driving circuits of the transistors be electrically isolated from each other, and that the switching be synchronous. Jones accomplishes the isolation and synchronous switching of series-connected transistors by employing one transformer for turning the switches on (labeled 200 in FIG. 2, driven by transistor Q1), and another transformer for turning the switches off (unlabeled, driven by transistor Q2).

Another application in which high voltages must be rapidly switched is in the use of external heart defibrillators. These devices supply controlled electrical pulses that are applied to the chests of patients in cardiac arrest. Defibrillators may also be implanted, in which case the electrical pulses are applied directly to the heart and the voltages to be switched naturally are much smaller. Older external defibrillators typically used mechanical relays as the switching devices. Defibrillators that are more modern typically use solid state switching circuits having power transistors to switch the high voltages. These power transistors may be metal-oxide semiconducting, field-effect transistors (MOSFET's), insulated gate bipolar transistors (IGBT's), or similar known devices.

SUMMARY OF THE INVENTION

In one aspect of the present invention, a switching circuit is disclosed that includes one or more switching devices, one or more detector and driver circuits, and at least one control and driving signal provider (hereafter, simply "signal provider"). The signal provider provides one or more control and driving signals at one or more output ports. The signal provider may also have one or more input ports for accepting one or more primary control signals. The control and driving signals are based at least in part on the primary control signals. In some implementations, a first output port of a first signal provider is electrically isolated from a second output port of the first signal provider. Also, a first in put port of a first signal provider may be electrically isolated from a first output port of the first signal provider.

The detector and driver circuits each have an input coupled to an output port of the signal provider. The detector and driver circuits each also have an output coupled to at least one of the switching devices. Each detector and driver circuit detects when a control and driving signal at its input is in an on state and, responsive thereto, drives at least one of the switching devices on by applying to it the control and driving signal. In addition, each detector and driver circuit detects when the control and driving signal is in an off state and, responsive thereto, drives at least one of the switching devices off by applying to it the control and driving signal.

Thus, for each detector and driver circuit of this aspect of the invention, the same signal (the control and driving signal) performs both the function of controlling the turning on and off of the switching devices and the function of driving the switching devices on and off in response to the controlling function. In contrast, conventional circuits typically employ separate signals for controlling and driving, and/or they employ one signal for controlling and driving the switching device on and another signal for controlling and driving the switching device off. For example, in the circuit described in Jones (referred to above), the pulses generated by the three gates U3 associated with Q1 on the primary sides of the two single-turn transformers provide the turning on (through Q1) control function. The driving signal magnetically induced on the secondary side of transformer 200 turns the switching transistors Q3–Q10 on. The pulses generated by the three gates U3 associated with Q2 on the primary sides of the two single-turn transformers provide the turning off (through Q2) control function. The driving signal magnetically induced on the secondary side of, the unlabelled transformer turns the switching transistors Q3–Q10 off. Thus, separate circuits and signals are used to drive the switching transistors on and off.

In some aspects of the present invention, the signal provider may be a transformer. In these aspects, the input ports of the signal provider are primary windings on the primary side of the transformer, and the output ports of the signal provider are secondary windings on the secondary side of the transformer.

In some implementations, the signal provider consists of a single signal provider. The word "single" in this context means only one signal provider, as contrasted with two or more. In particular, in an implementation in which the signal provider is a transformer, a single transformer may be used to turn the switching devices on and off, rather than the two transformers used, for example, by Jones. In this single-transformer implementation of the present invention, advantages are therefore gained in terms of expense, weight, and volume as compared to the two-transformer circuit described in Jones.

Conventional switching circuits are known that employ single transformers. In particular, FIGS. 1 and 2 of U.S. Pat. No. 5,939,927 to Myers show switching circuits having only one transformer. However, in these conventional circuits, the same signal is not used both to control the off state and to drive the switching device off. Rather, as described in Myers, the switching device is turned off when current in the secondary winding of the transformer is reversed, thereby turning on a depletion mode transistor that causes the gate of the switching transistor to discharge and thus cause the switching transistor to turn off. The switching transistor therefore is not driven off (either by the control signal or, another signal), but, rather, is enabled to discharge into an off state. Also, the circuit in Myers requires that an "on" state be followed by an "off" state, and that the period of the "on" state be within particular time constraints as established by the design values. The range of possible "on" time is determined by the magnetizing inductance of the transformer, the level at which its core saturates, and the voltage applied to its primary. An "off" state must follow an "on" state in this conventional circuit because when the primary ceases to be driven the field collapses. This collapsing field drives the secondary in the reverse direction, thereby allowing the depletion mode transistor to turn on, thus turning off the switching device.

The conventional circuits described in Myers generally require a transformer having a large magnetizing inductance that acts to slow the rate of increase of primary current. The current may thus be held below a level at which the core saturates even though the primary is excited during the entire "on" time of the switching device. In contrast, aspects of the present invention drive the switching device on and off without requiring a transformer with large magnetizing inductance. This arrangement is advantageous because a large magnetizing inductance, as in Myers, generally results in a large leakage inductance having series impedance that slows the driving on and off of the switching transistor. Furthermore, if a number of switching transistors are being switched in series, the large magnetizing inductance may result in a skew between the driving on or off of one or more of the switching transistors as compared to one or more of the other switching transistors. That is, the switches may not all switch at substantially the same time. In that case, the switches may not properly share the voltage across the series connection during transitions between "on" and "off" states.

Another conventional circuit that employs a single transformer is described in U.S. Pat. No. 5,781,040 to Myers. As shown in FIG. 2, the switching device of this circuit is not driven to the "off" state, as is the case with respect to aspects of the present invention. Actively driving the switching device off generally is advantageous because faster switching times can be reliably achieved. In addition, the circuit described in the '040 patent relies on a change in control-signal frequency to distinguish on and off control, and thus does not lend itself to rapid switching. That is, because time inherently is required to distinguish one frequency from another (i.e., the differences in periods cannot be ascertained until the periods have passed), switching delays are inherent.

In aspects of the present invention, the switching devices may include one or more transistors. In various implementations, these one or more transistors may include one or more field-effect transistors, one or more insulated-gate bipolar transistors, one or more MOS controlled thyristors (MCT's), or similar transistor devices. These examples are intended to be illustrative rather than limiting, and any other known switching device, or one to be developed in the future, may be used in other implementations of the present invention.

As noted, the signal provider may include a transformer having one or more primary windings on the primary side and one or more secondary windings on the secondary side. In some aspects of the invention, the input of a first detector and driver circuit is coupled to a first of the secondary windings, and a first control and driving signal includes a voltage waveform across the first secondary winding. The first detector and driver circuit may include an on-threshold detector that detects that the first control and driving signal is in the "on" state when its voltage reaches an on-threshold voltage. The on-threshold detector may include a zener diode or other voltage reference. Furthermore, the first detector and driver circuit may include an off-threshold detector that detects that the first control and driving signal is in the "off" state when its voltage reaches an off-threshold voltage. The off-threshold detector may also include a zener diode or other voltage reference. In some aspects of the present invention, the on-threshold and off-threshold voltages may be of opposite polarities, and the zener diodes of the on-threshold and off-threshold detectors may each be coupled in parallel with the first secondary winding and in opposing polarities with respect to each other.

In some aspects of the present invention, a detector and driver circuit includes a driver circuit that drives a switching device on responsive to the on-threshold detector detecting that a control and driving signal is in the "on" state. The driver circuit also drives the switching device off responsive to the off-threshold detector detecting that the control and driving signal is in the "off" state. The driver circuit includes a first driving switch that couples the control and driving signal to the switching device so as to turn it on when the on-threshold detector detects that the first control and driving signal is in the on state. The driver circuit also includes a second driving switch that couples the control and driving signal to the switching device so as to turn it off when the off-threshold detector detects that the first control and driving signal is in the off state. The first and second driving switches are field-effect transistors in some implementations of the present invention, although any of numerous other known switching devices, or ones to be developed in the future, may also be used.

The present invention, in some aspects, includes a first detector and driver circuit that detects when a first control and driving signal including a voltage waveform across a first secondary winding on the secondary side of the transformer is in an on state and, responsive thereto, applies the first control and driving signal to drive a first of the switching devices on. A second detector and driver circuit detects when a second control and driving signal including a voltage waveform across a second secondary winding is in an on state and, responsive thereto, applies the second control and driving signal to drive a second of the switching devices on. The first and second detector and driver circuits may be electrically isolated from each other. The first and second switching devices may be turned on synchronously.

The word "synchronously" is used broadly in the context of turning the switching devices on or off to refer to a timing relationship. This relationship may be that of turning the first and second switching devices on (or off) at substantially the same time. Although this particular timing relationship often is advantageous, the timing relationship denoted herein by the word "synchronously" is not limited to this example. For instance, the second switching device may be turned on (or off) at a time after the first switching device is turned on (or off). That is, a delay in the switching may be introduced in accordance with any of a variety of known techniques. Thus, the words "synchronously," "synchronized," and grammatical variants thereof, generally encompass implementations in which a first switching device is turned on when a second switching device is turned off, or vice versa. In these implementations, the switching devices may be referred to as being in opposite phases, as compared to being in the same phase when they both are turned on at substantially the same time and are turned off at substantially the same time.

In some aspects of the present invention, the first and second switching devices may be coupled to each other in series. These switching devices may be insulated-gate bipolar transistors, or field-effect transistors, in which case the emitter or source of the first switching device may be coupled to the collector or drain of the second switching device, the first control and driving signal may be applied to the gate of the first switching device, and the second control and driving signal may be applied to the gate of the second switching device. However, as noted, the invention is not limited to these examples; the first and/or second switching devices may be any of a variety of other known, or yet to be developed, switching devices.

In some aspects of the invention, a controller applies to a first primary driven winding on the primary side of the transformer a first set of voltages, thereby generating (i) a first current in the first primary driven winding, (ii) a first magnetic field having a first quantum of energy, and (iii) a magnetically induced second set of voltages in the first secondary winding. The controller interrupts the first current, thereby causing the first magnetic field to collapse, and, not later than interrupting the first current, clamps the first primary driven winding to a third set of voltages, thereby magnetically inducing a fourth set of voltages in the first secondary winding. At least one of the fourth set of voltages is less than at least one of the second set of voltages, optionally by a predetermined amount. In some implementations, at least one of the fourth set of voltages may be less than each of the second set of voltages. In yet further implementations, each of the fourth set of voltages may be less than each of the second set of voltages. The first control and driving signal includes the second and fourth sets of voltages. The "on" state of the first control and driving signal may include one or more of the second set of voltages.

The switching circuit in accordance with these aspects of the invention may include a driver circuit that drives the first switching device on when the on-threshold detector detects that the first control and driving signal comprises one or more of the second set of voltages. The first switching device may remain on when the first control and driving signal comprises one or more of the fourth set of voltages. As described below with respect to one illustrative implementation, the lower values of the fourth set of voltages as compared to the second set of voltages are such that the on-threshold detector does not detect the fourth set of voltages as an "on" state of the first control and driving signal. However, the fourth set of voltages also is not detected by the off-threshold detector as an "off" state of the first control and driving signal. Thus, the first switching device may remain on because it has not been driven off. As also described below with respect to one illustrative implementation, energy stored in the control and driving signal provider (which is a transformer in that implementation) when the second set of voltages is induced may be removed during the period when the fourth set of voltages is induced. Thus, excess energy does not build up in the transformer core.

In order to drive the first switching device off, the controller applies to a second primary driven winding a fifth set of voltages having polarities opposite to polarities of the first set of voltages. In some implementations, the first and second primary driven windings may be the same winding. This fifth set of voltages thereby generates (i) a third current in the primary driven winding, (ii) a third magnetic field having a third quantum of energy, and (iii) a magnetically induced sixth set of voltages in the first secondary winding having polarities opposite to polarities of the second set of voltages. In addition, the controller interrupts the third current, thereby causing the third magnetic field to collapse, and, not later than interrupting the third current, clamps the second primary driven winding to a seventh set of voltages, thereby magnetically inducing an eighth set of voltages in the first secondary winding. The magnitude of at least one of the eighth set of voltages is less than a magnitude of at least one of the sixth set of voltages. The term "magnitude" is used in this context to avoid confusion due to the use of negative values as compared to the voltage values of the first through fourth sets of voltages. In particular, the sixth and eighth sets of voltages may have negative values as compared with the second and fourth sets of voltages, which may illustratively be assumed to have positive values. For example, a voltage value in the sixth set may be −18 volts and a voltage value in the eighth set may be −6 volts. The, magnitude of the value of −6 volts should be understood to be less than the magnitude of −18 volts, as used herein, even though −18 is a smaller number than −6 in the sense that it is more negative. The sixth and eighth sets of voltages are included in the first control and driving signal.

In these aspects of the invention, the controller clamps the second primary driven winding to the seventh set of voltages such that a magnitude of at least one of the eighth set of voltages is less than a magnitude of at least one of the sixth set of voltages by at least a predetermined amount. The driver circuit may drive the first switching device off when the off-threshold detector detects that the first control and driving signal comprises one or more of the sixth set of voltages. The first switching device may remain off when the first control and driving signal comprises one or more of the eighth set of voltages. In particular, the eighth set of voltages does not cause the first switching device to be turned on. The advantage of providing that the first control and driving signal may include the lower-magnitude eighth set of voltages, even though the eight set of voltages does not drive the first switching device off, is similar to that noted above with respect to the inclusion in the first control and driving signal of the fourth set of voltages. That is, energy stored in the control and driving signal provider (i.e., the transformer in one illustrated implementation) may be released during the time when the first control and driving signal includes the eight set of voltages without driving the switching device on.

Thus, in the foregoing aspects of the invention, the "on" state of the first control and driving signal includes one or more of the second set of voltages, and the "off" state of the first control and driving signal includes one or more of the sixth set of voltages. The on-threshold detector detects that the first control and driving signal is in the "on" state when one or more of the second set of voltages reaches the on-threshold voltage. The off-threshold detector detects that the first control and driving signal is in the "off" state when one or more of the sixth set of voltages reaches the off-threshold voltage.

The first set of voltages may include a voltage pulse having a substantially constant amplitude. The fifth set of voltages may include a voltage pulse having a substantially constant amplitude and having opposite polarity to the voltage pulse of the first set of voltages.

The primary windings of the transformer, in some aspects of the invention, include a primary clamp winding. The controller applies the first set of voltages to the first primary driven winding from a voltage supply having an output and a return, thereby generating the first current in a first current path including from the output to the return. The controller provides, not later than interrupting the first current, a second current path for a second current from the return to the output through at least the primary clamp winding. The second current generates a second magnetic field having substantially the first quantum of energy. The controller maintains the second current path for a period of time such that the first quantum of energy is returned to the power supply. The primary clamp winding may include the second primary driven winding. In some implementations, the primary clamp winding has a first number of turns, the first primary driven winding has a second number of turns, and the secondary winding has a third number of turns. A first ratio between the first number and second number, and a second ratio between the first number and the third number, are determined so that a first voltage magnetically coupled to the secondary winding by the first primary driven winding when the first magnetic field is generated is greater than a second voltage magnetically coupled to the secondary winding by the primary clamp winding when the second magnetic field is generated. The first voltage may be greater than the second voltage by at least a predetermined amount.

The circuit in accordance with these aspects of the invention avoids saturation of the transformer core by providing the second current path and allowing the energy in the transformer core to return to the power supply. Moreover, because of the choice of ratios of windings as stated, the voltages magnetically induced on the secondary side of the transformer during the return of energy to the power supply are not large enough to trigger the off-threshold detectors. Thus, the switching devices may remain in the "on" state during the period when the energy is returning to the power supply. These aspects of the invention therefore provide the advantage, as compared for example with the circuits described in the '927 patent to Myers (noted above), of cascading "on" states and thus enabling the switching devices to stay on for extended periods. Conversely, because of the rapid switching times attainable in accordance with aspects of the present invention, the switching devices may be switched on for very short periods in rapid succession. Advantageously, both lengthy "on" periods and rapid on and off switching are possible without altering component design values.

In additional aspects of the present invention, a method is described for switching one or more switching devices. The method includes the steps of: (a) detecting when a first control and driving signal is in an on state; (b) responsive to step (a), driving at least one of the switching devices on by applying to it the first control and driving signal; (c) detecting when the first control and driving signal is in an off state; and, (d) responsive to step (c), driving at least one of the switching devices off by applying to it the first control and driving signal. Step (a) may include detecting that the first control and driving signal is in the on state when its voltage reaches an on-threshold voltage. Step (c) may include detecting that the first control and driving signal is in the off state when its voltage reaches an off-threshold voltage.

In some implementations, this method may also includes the steps of (e) detecting when a second control and driving signal is in an on state; and, (f) responsive to step (e), applying the second control and driving signal to drive a second of the switching devices on. In these implementations, the first and second switching devices may be turned on synchronously. Also, in some implementations, the method includes the steps of (e) detecting when a second control and driving signal is in an off state; and, (f) responsive to step (e), applying the second control and driving signal to drive a second of the switching devices off. In these implementations, the first switching device may be turned on, and the second switching device is turned off, synchronously.

In accordance with the method noted above with respect to steps (a) through (d), some implementations may also include the step of (e) prior to step (a), applying a first set of voltages to a primary driven winding of a transformer, thereby generating (i) a first current in the primary driven winding, (ii) a first magnetic field having a first quantum of energy, and (iii) a magnetically induced second set of voltages in a first secondary winding on the secondary side of the transformer. These implementations also include the steps of (f) prior to step (c), interrupting the first current, thereby causing the first magnetic field to collapse; and (g) not later than interrupting the first current and prior to step (c), clamping the primary driven winding to a third set of voltages, thereby magnetically inducing a fourth set of voltages in the first secondary winding. At least one of the fourth set of voltages is less than at least one of the second set of voltages. The first control and driving signal includes the second and fourth sets of voltages. Step (g) may include clamping the primary driven winding to the third set of voltages such that at least one of the fourth set of voltages is less than at least one of the second set of voltages by at least a predetermined amount. The "on" state of the first control and driving signal may include one or more of the second set of voltages.

The above aspects and implementations of the present invention are not necessarily inclusive or exclusive of each other and may be combined in any manner that is non-conflicting and otherwise possible, whether they be presented in association with a same, or a different, aspect or implementation of the invention. The description of one aspect is not intended to be limiting with respect to other aspects. In addition, any one or more function, step, operation, or technique described elsewhere in this specification may, in alternative aspects, be combined with any one or more function, step, operation, or technique described in the summary. Thus, the above aspects are illustrative rather than limiting.

BRIEF DESCRIPTION OF THE DRAWINGS

The invention will be more clearly appreciated from the following detailed description when taken in conjunction with the accompanying drawings, in which like reference numerals indicate like structures or method steps in which the leftmost digit of a reference numeral may indicate the number of the figure in which the referenced element or step first appears (for example, the element 220 appears first in FIG. 2), and wherein.

DETAILED DESCRIPTION

Figure 1:
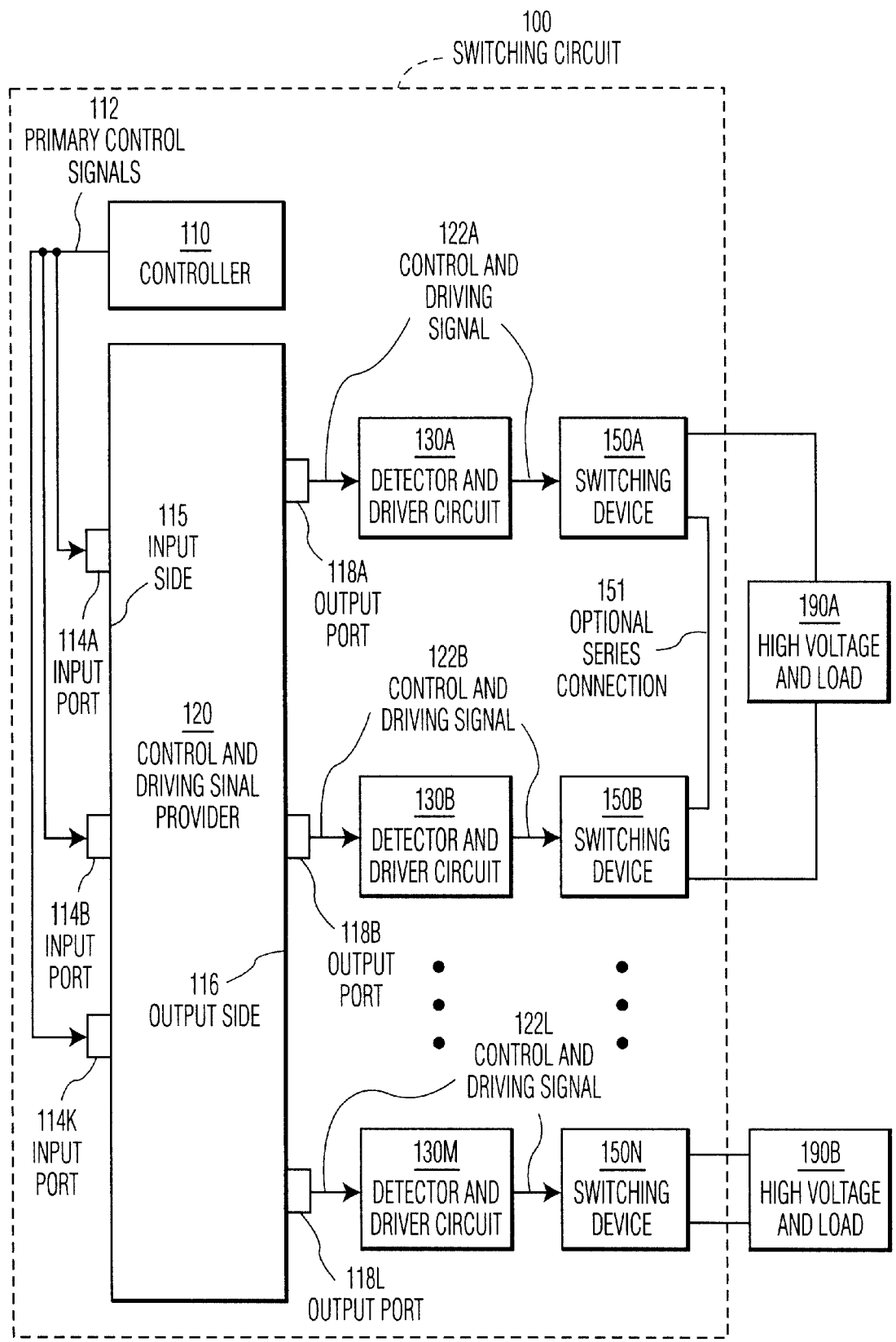
FIG. 1 is a functional block diagram of one embodiment of a switching circuit in accordance with one aspect of the present invention.

The attributes of the present invention and its underlying method and architecture will now be described in detail with reference to an illustrative switching circuit 100, a functional block diagram of which is shown in FIG. 1. In some implementations, switching circuit 100 provides high speed, synchronous, switching of one or more loads. However, the invention is not so limited, as the switching need not be high speed and/or synchronous in other implementations. Moreover, one or more of the switched loads may, but need not, present high voltages to switching circuit 100. Illustrative examples of loads presenting high voltages are represented in FIG. 1 by high voltage and load 190A and high voltage and load 190B, generally and collectively referred to as "loads 190."

A number "N" of switching devices, generally and collectively referred to as "switching devices 150," are included in switching circuit 100 of the illustrated embodiment. "N" may be any integer equal to or greater than one. Switching devices 150 switch one or more of loads 190. FIG. 1 shows an example in which "N" switching devices 150A, 150B, and so on up to device 150N, are included in circuit 100. Switching devices 150 may, but need not, be high-power switches such as power transistors. The outputs of some of switching devices 150 may be connected in series with each other and, collectively, in parallel with a load such as represented by high voltage and load 190A. As indicated by optional series connection 151 between switching devices 150A and 150B, those two devices are connected in series in the example of FIG. 1. In other examples, any number of additional switching devices could be connected in series to switch a load. As will be evident to those skilled in the relevant art, an advantage of connecting two or more switching devices in series is to allow the switching of a load presenting a larger voltage than could be handled by a single switching device. This is so because the larger voltage is distributed across the outputs of the series-connected switches. As indicated by the lack of connection between switching devices 150B and 150N, it is not necessary that any or all of switching devices 150 be connected in series. Thus, as in the illustrated example, series-connected switching devices 150A and 150B together may switch load 190A, whereas switching device 150N alone may switch load 190B.

Switching circuit 100 also includes a number "M" of detector and driver circuits, generally and collectively referred to as detector and driver circuits 130. "M" may be any integer equal to or greater than one, and need not be equal to "N." In the illustrated example, each of detector and driver circuits 130 detects when a control and driving signal is in an "on" state and, responsive thereto, drives at least one of switching devices 150 on by applying to it the control and driving signal in the "on" state. For example, detector and driver circuit 130A detects when control and driving signal 122A is in an "on" state and applies signal 122A to switching device 150A to turn it on. There may be a number "L" of control and driving signals, such as signals 122A, 122B, and 122L of FIG. 1, generally and collectively referred to as "control and driving signals 122." "L" may be any integer equal to or greater than one, and need not be equal to "N" or "M."

Each of the illustrated detector and driver circuits 130 also detects when the control and driving signal is in an "off" state and, responsive thereto, drives at least one of the switching devices off by applying to it a control and driving signal 122 in the "off" state. In the illustrated example, detector and driver circuit 130A drives switching device 150A on or off, detector and driver circuit 130B drives switching device 150B on or off, and detector and driver circuit 130M drives switching device 150N on or off. In other examples, one detector and driver circuit could drive two or more switching devices. Also, a switching device could be turned on by one or more detector and driver circuits and turned off by one or more detector and driver circuits that need not be the same as the circuits that turned the switching device on.

Figure 3A:
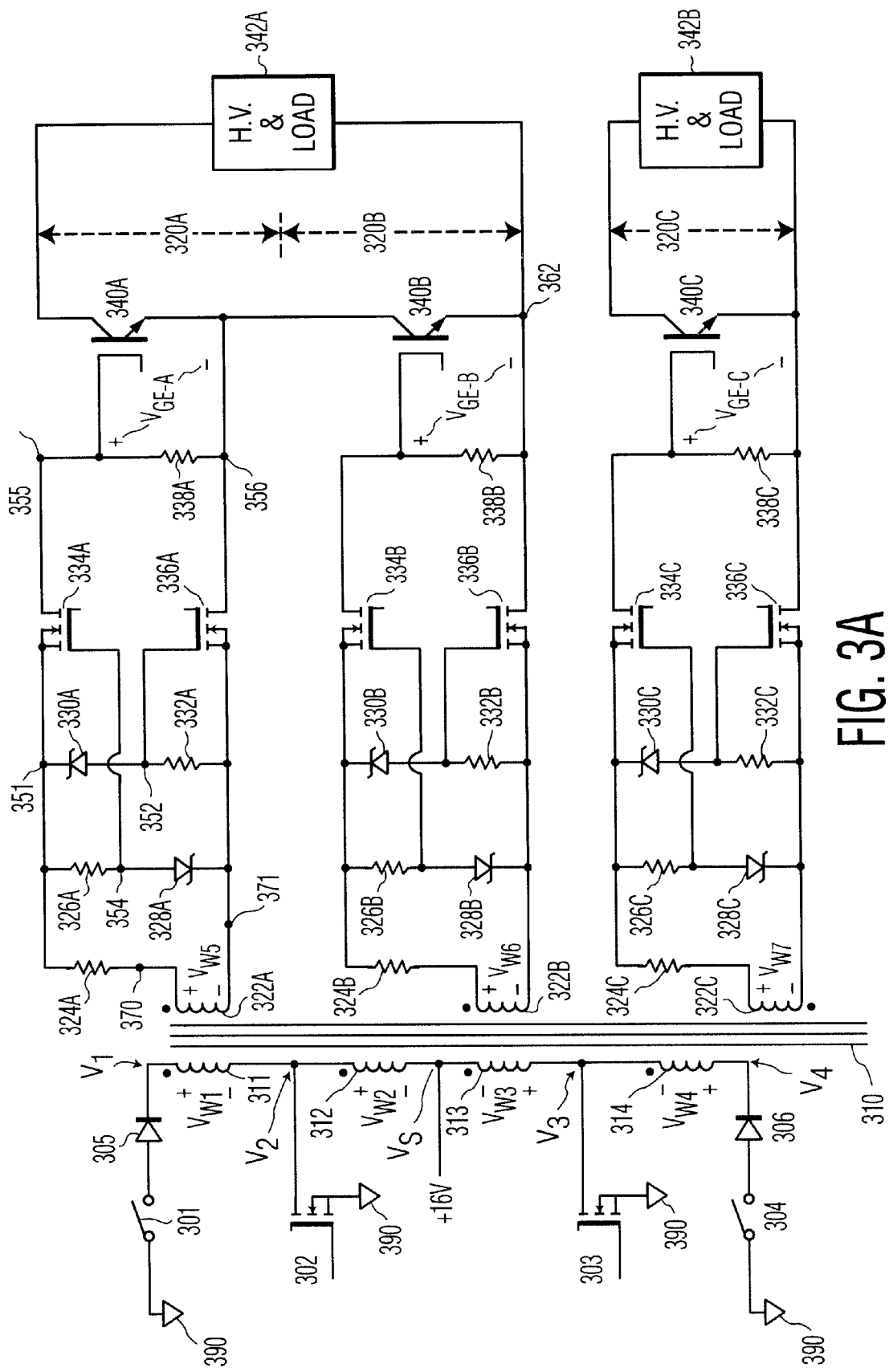
FIG. 3A is a simplified circuit diagram of one implementation of the switching circuit of FIG. 1.

In many, but not all, implementations, it is advantageous that detector and driver circuits 130 be electrically isolated from each other rather than being coupled to a common voltage, such as ground. Otherwise, some of circuits 130 may be damaged by excessive voltages between the common voltage and the high voltages present at the outputs of some of the series-connected switching devices. Although not shown in FIG. 1 for clarity and to preserve generality, those implementations of a detector and driver circuit 130 in which isolation is important typically include coupling a common node of that circuit to a node at which two of switching devices 150 are serially connected to each other. An example is shown in FIG. 3A, described below, with respect to node 356. Another example in which isolation typically is used is in so-called "high-side" switching, such as is implemented by switches 601–604 of FIG. 6, described below.

Switching circuit 100 also includes control and driving signal provider 120 (hereafter, simply "signal provider 120"). Signal provider 120 in the illustrated embodiment has a number "K" of input ports 114, where "K" is any integer equal to or greater than one. Signal provider 120 also has a number "L" of output ports 118, each providing a control and driving signal 122. "L" need not be equal to "K." Although a single signal provider 120 is shown in FIG. 1, it need not be so in alternative implementations. For example, one signal provider could provide control and driving signal 122A, another signal provider could provide control and driving signal 122B, and so on.

In implementations in which it is desired to provide electrical isolation between or among one or more of detector and driver circuits 130, one or more of output ports 118 of signal provider 120 may be electrically isolated from each other. In addition, it may be desired to provide electrical isolation between or among one or more of input ports 114, and/or between or among one or more of input ports 114 and one or more of detector and driver circuits 130. In those cases, one or more of input ports 114 may be electrically isolated from other of input ports 114 and/or from one or more of output ports 118.

Signal provider 120 may, but need not, be a transformer. If signal provider 120 is a transformer, then input side 115 of signal provider 120 is the primary side of the transformer and output side 116 of signal provider 120 is the secondary side of the transformer. In those implementations, input ports 114 typically include one or more primary windings and output ports 118 typically include one or more secondary windings. If signal provider 120 is a transformer, it may, but need not, provide electrical isolation between or among its primary windings, between or among its secondary windings, and/or between or among any combination of primary and secondary windings. In other implementations in which electrical isolation is desired, signal provider 120 may be another known device, or one to be developed in the future, that optionally enables one or more of detector and driver circuits 130 to be electrically isolated from each other and/or from input ports 114, and that enables control and driving signals 122 to be provided to the detector and driver circuits.

When the outputs of two or more of switching devices 150 are connected in series, it typically is advantageous that the series-connected devices switch synchronously, and often it is desired that they switch substantially at the same time. Otherwise, the load to which the series-connected devices are connected may not be switched at the intended time and/or one or more of the switching devices may be damaged by excessive voltages and/or currents. In implementations in which signal provider 120 is a transformer, synchronization generally is achieved because of magnetic coupling between a driven primary winding and one or more secondary windings. For example, if signal provider 120 is a transformer, then input port 114A may be a driven primary winding that is driven by a voltage signal such as is represented in FIG. 1 by primary control signals 112.

The illustrated implementation of switching circuit 100 further includes controller 110. Controller 110 applies one or more primary control signals 112 to one or more of input ports 114 of signal provider 120. Controller 110 may also configure or reconfigure current paths that include one or more of input ports 114 and a power supply (not shown) for the voltage signals. Controller 110 may be any of a variety of known devices or circuits, or ones to be developed in the future, for opening and closing switches in order to provide voltage or current signals to input ports 114 and/or to configure or reconfigure current paths including one or more of input ports 114. As one of many possible examples, controller 110 may include semiconductor switches and a microprocessor or programmable logic device or circuit that is programmable to open and close the switches in order to configure and reconfigure current paths from a power supply to one or more of input ports 114.

In implementations in which signal provider 120 is a transformer, it generally is advantageous to provide that magnetic energy generated by applying voltage signals to the primary windings of the transformer not result in saturation of the transformer core. In accordance with a method described below in relation to FIGS. 3A, 3B, and 4A–4G, controller 110 causes primary control signals 112 to be applied to input ports 114, and current paths to be configured and reconfigured, to avoid saturation of the transformer core.

Figure 2:
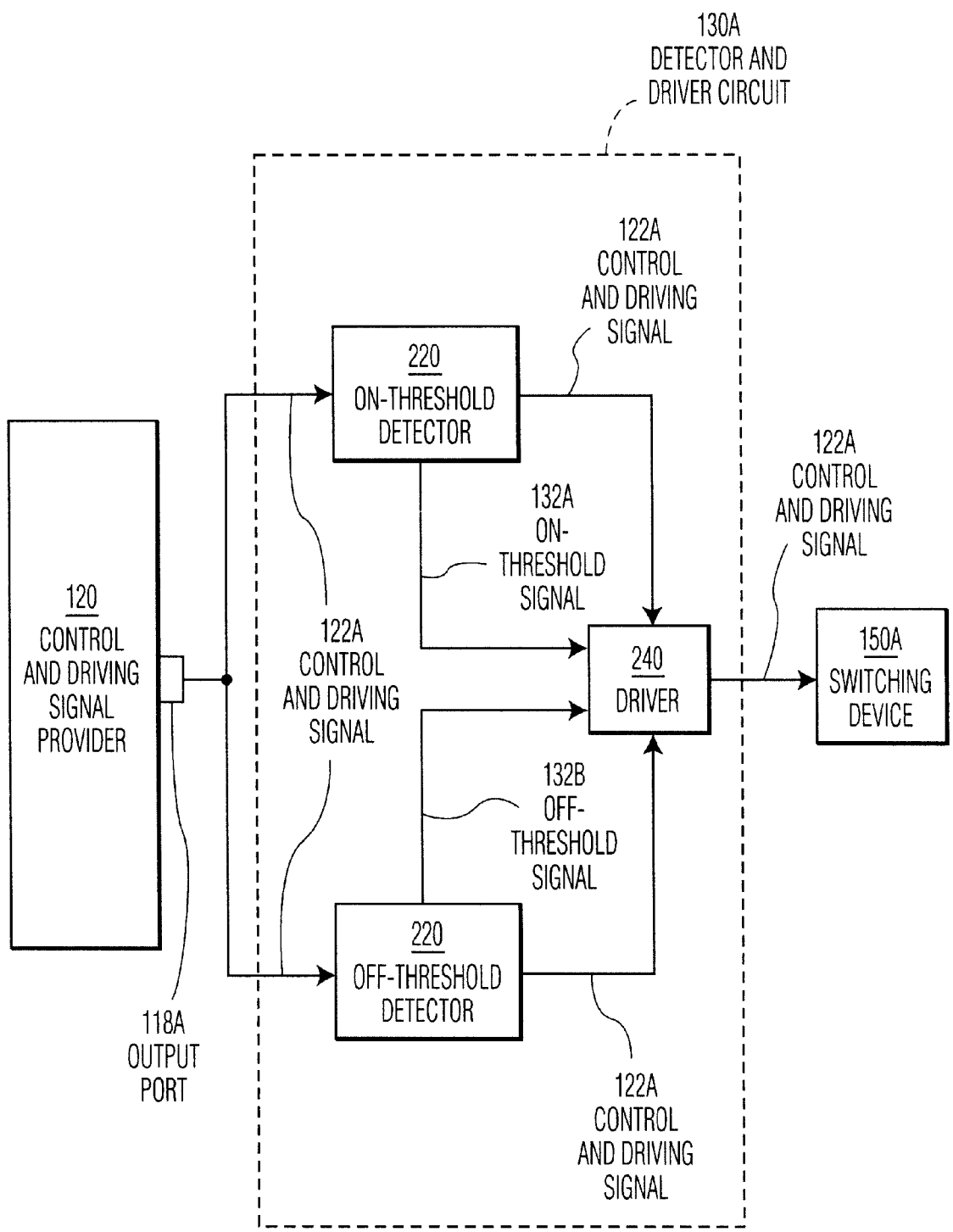
FIG. 2 is a functional block diagram of one embodiment of a detector and driver circuit of the switching circuit of FIG. 1.

The Illustrative Detector and Driver Circuit of FIG. 2

The operations of detector and driver circuits 130 are now described in greater detail with respect to FIG. 2. FIG. 2 is a block diagram of one implementation of an illustrative one of detector and driver circuits 130 of FIG. 1; i.e., circuit 130A. As shown in FIG. 2, circuit 130A includes an on-threshold detector 220, an off-threshold detector 230, and a driver 240. Control and driving signal 122A is provided to both detectors 220 and 230. For example, with reference to one illustrative implementation referred to above, detectors 220 and 230 may each have input nodes that are connected across a secondary winding (i.e., across output port 118A) of a transformer (i.e., signal provider 120). In that example, control and driving signal 122A includes the values of voltages that appear over time across the secondary winding. In other implementations, control and driving signal 122A could alternatively include current values.

For convenience of illustration only, it hereafter will be assumed that control and driving signals 122 (i.e., signals 122A, 122B, and so on including 122L), are voltage waveforms. That is, each of signals 122 is a series of voltage values over time. Thus, at any particular point in time, each of signals 122 may be said to have a particular voltage, meaning that the signal has that value of voltage. These voltage values may vary or not and, if they vary, may vary continuously or discretely. A portion of a voltage waveform, i.e., the voltage values of one of signals 122 over a particular period, may be referred to as a particular set of voltages. For example, the voltage values of control and driving signal 122A during a particular period may be referred to hereafter as "a first set of voltages," the voltage values during another period may be referred to as "a second set of voltages," and so on. Similarly, primary control signals 112 may hereafter be referred to for convenience of illustration as voltage waveforms constituted by a series of voltage values over time, and the values over a particular period may be referred to as a set of voltages.

On-threshold detector 220 detects that control and driving signal 122A is in an "on" state when its voltage reaches an on-threshold voltage. The term "on" state means that the switching device coupled to detector and driver circuit 130A, i.e., switching device 150A in this example, is to be turned on. Thus, signal 122A is a control signal that includes information, such as in the form of voltage values, intended to indicate that switching device 150A is to be turned on. In particular, in the implementation illustrated in FIG. 2, on-threshold detector 220 is a device or circuit for comparing the voltage values of signal 122A to a reference voltage and to detect an indication to turn switching device 150A on when the reference voltage is reached. For example, when the voltage value of signal 122A reaches (or exceeds) a particular on-threshold value, detector 220 detects that signal 122A is in an "on" state. In a similar manner, off-threshold detector 230 of the illustrated implementation detects that control and driving signal 122A is in an "off" state when its voltage reaches an off-threshold voltage. Either or both of the on-threshold and off-threshold values may be predetermined, or, alternatively, they may be determined in real time. In alternative implementations, any known or future device or circuit for detecting at least two states of a signal (e.g., "on" and "off" states) may be employed, whether or not threshold detection is included.

Driver 240 drives switching device 150A on responsive to on-threshold detector 220 detecting that control and driving signal 122A is in the "on" state, and drives signal 122A off responsive to off-threshold detector 230 detecting that signal 122A is in the "off" state. In FIG. 2, on-threshold signal 132A and off-threshold signal 132B represent respective indications by detectors 220 and 230 to driver 240 of these respective states. Signals 132A and 132B may be provided in accordance with any of a variety of known techniques, such as by providing particular voltage values at one or more inputs of driver 240. Driver 240 may perform its operations of driving switching device 150A on or off in accordance with any of a variety of known techniques. For example, signals 132A and 132B may be voltage values that are selectively applied by driver 240 to turn on or off a gate of a power transistor (i.e., the power transistor is switching device 150A).

It will be understood that the above-described operations of detector and driver circuit 130A may be illustrative of the operations of any of detector and driver circuits 130. One of many possible implementations of detector and driver circuits 130, and other elements of switching circuit 100, are now described with respect to FIGS. 3A and 3B.

The Switching Circuit of FIG. 3A

FIG. 3A is a circuit diagram of one implementation of switching circuit 100. In FIG. 3A, transformer 310 is an implementation of signal provider 120 of FIG. 1. Transformer 310 has primary windings 311, 312, 313, and 314. Transformer 310 also has secondary windings 322A, 322B, and 322C (hereafter generally and collectively referred to as "secondary windings 322"). The primary windings are implementations of input ports 114 and the secondary windings are implementations of output ports 118.

As noted above, switching circuit 100 may advantageously be used in applications in which fast switching is desired, e.g., in high-power switching supplies and amplifiers or for switching voltages in defibrillators. It generally is thus desirable to design transformer 310 to minimize the series impedance presented by the transformer and thus to increase the responsiveness of the transformer to rapid voltage and/or current changes. One technique that may be used for this purpose is to wind the primary and secondary windings "in hand." That term is used to indicate that each of the windings is wound at the same time, i.e., they are wound together on the core. Another conventional way to say that windings are wound in hand is to say that two windings are bi-filer, three windings are tri-filer, and so on. Windings that are wound in hand are tightly magnetically coupled and thus minimize leakage inductance. Tight magnetic coupling between the primary and secondary windings, and low leakage inductance (i.e., low series impedance), tend to improve the responsiveness of the transformer. That is, a step voltage pulse on one primary winding will be magnetically coupled to the secondary windings (and to the other primary windings) with less delay than would be the case if the magnetic coupling were less tight and/or the leakage inductance were greater. It is therefore generally preferable in implementations in which fast switching is desired to wind primary windings 311–314 and secondary windings 322 in hand. Thus, in the illustrated embodiment, the seven wires that make up these windings advantageously are bundled together and then wound together around the core of transformer 310. Because winding in hand positions the windings in close physical proximity to each other, care should be taken to provide the windings with adequate galvanic insulation to prevent short circuits between the windings when high voltages are present on them.

An advantage of providing that the transformer has a relatively low number of turns is that windings generally are easier to insulate from one another because they have less surface area. Thus, the transformer is not only better coupled, but also is smaller than would otherwise be the case in high voltage applications. An alternative approach to isolating windings of larger magnetizing inductance would be to use a split bobbin or to separate the windings on the core. However, this approach generally would result in greater leakage inductance.

Other techniques may also be used to minimize the leakage inductance of transformer 310. For example, leakage inductance generally is reduced if the number of turns of the windings is reduced. Windings having equal numbers of turns generally have tighter magnetic coupling and lower leakage inductance than windings with unequal numbers of turns. In addition, leakage inductance generally is lower if the windings are distributed evenly around the core rather than unevenly distributed. Also, the shape of the core generally affects the leakage inductance. A core in the shape of a toroid is generally desirable in this respect, although various other shapes and techniques known to minimize leakage inductance may be used. For example, it is known to build a planar transformer having relatively low leakage inductance around a printed circuit board. Windings are made that employ the board material as insulation between successive layers of windings made of conductor etchings.

Thus, to reduce leakage inductance, the illustrative seven windings of transformer 310 may in some implementations be wound in hand, be evenly distributed around a torroidal core, and have a relatively low number of turns. For example, it is hereafter assumed for illustrative purposes that primary windings 312 and 313 and secondary windings 322 each have eight turns wound in hand. For reasons described below, it is also hereafter assumed for illustrative purposes that primary windings 311 and 314 each have 16 turns. Eight of these 16 turns are wound in hand with the other primary windings and the secondary windings, and the remaining eight are evenly distributed alongside the first eight. It will be understood, however, that other implementations could employ windings with any other numbers of turns, that are not wound in hand, and/or are not evenly distributed.

The function of controller 110 of providing primary control signals 112 to input ports 114 are implemented by switches 301 and 304 and by transistors 302 and 303 (hereafter, simply "switches 301–304"), in conjunction with diodes 305 and 306. Switches 302 and 303 are shown as single-transistor switches, such as MOSFET switches. However, this representation is illustratively only. Any of numerous conventional transistor switches, or other types of switches, may be used. Also switches 301 and 304 are represented for convenience of illustration by simple switch elements, although active switching circuits typically would be used. It is not material to the present invention, however, how switches 301–304 are implemented.

Switches 301–304 operate under the control of known circuits or devices (not shown). For example, a microprocessor, other logic devices, or an analog controller, together with actuator devices or circuits, of any of a variety of known designs may be used to open and close switches 301–304. Those skilled in the relevant art will appreciate that these conventional controllers and actuators generally will be such as to provide, and operate in accordance with, the voltages, currents, switching times, and other parameters of the circuit of FIG. 3A as described below.

Figure 4A:
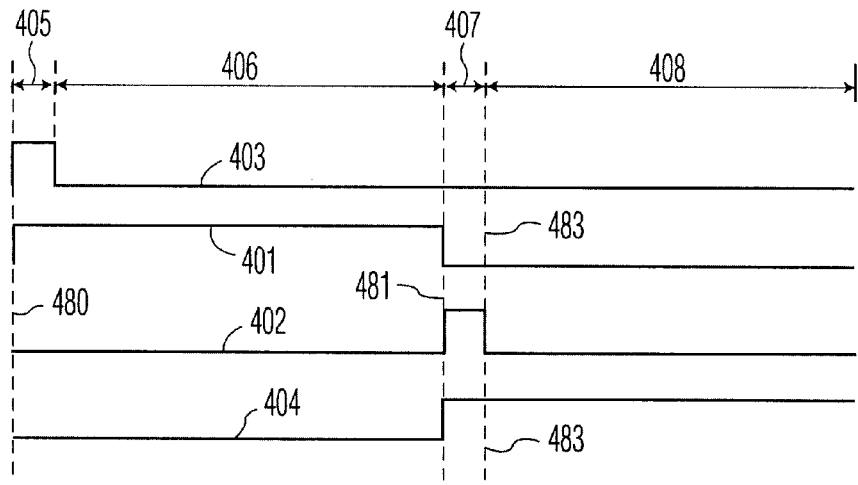
FIGS. 4A–4G are graphical representations of illustrative embodiments of control signals applied to, and voltage waveforms measured at, various elements of the circuit of FIG. 3A, wherein the control signals and voltage waveforms are aligned along a common time axis.

FIG. 4A shows graphical representations of illustrative primary control signals 112 that may be applied to switches 301–304. Primary control signal 403 is applied to switch 303, primary control signal 401 is applied to switch 301, primary control signal 402 is applied to switch 302, and primary control signal 404 is applied to switch 304. These primary control signals are vertically aligned in FIG. 4A along a common horizontal time axis, as indicated by vertical dashed lines 480, 481, and 483. It will be understood that these primary control signals represent only one method for operating switches 301–304. As will be described, this method provides appropriate control and driving signals 122 consistent with the operation of the portion of the circuit of FIG. 3A on the secondary side of transformer 310 without saturating the core of transformer 310. However, other methods and/or circuits applied on the primary side of transformer 310 could be used to provide control and driving signals 122 on the secondary side of transformer 310.

In accordance with the illustrative method, switches 303 and 301 are initially on; that is, they are closed. This "on" state is represented by the high level of primary control signal 403 during the initial period 405 and by the high level of primary control signal 401 during this period (and during period 406). Switches 302 and 304 are off, i.e., they are open, during periods 405 and 406, as indicated by the low levels of primary control signals 402 and 404.

During the period 405, a current path exists from a voltage supply having an output node labeled $V_S$ in FIG. 3A, through primary winding 313, through closed switch 303, to a common voltage 390 (which may, but need not, be ground). For illustrative purposes, it will be assumed that the power supply presents a constant 18 volts at $V_S$. Thus, 18 volts is impressed across primary winding 313. Winding 313 may hereafter be referred to as a "primary driven winding" to indicate that, in this configuration of switches 301–304, voltages imposed on winding 313 in accordance with control signals 401–404 drive voltages in the other primary windings and in secondary windings 322 through magnetic coupling.

As noted, it is illustratively assumed that driven winding 313 has eight turns. Thus, because primary winding 312 and secondary windings 322 also have eight turns each, they also have 18 volts across them due to magnetic coupling. Because primary winding 311 is illustratively assumed to have 16 turns, it has 36 volts across it. The winding sense of each winding is indicated in FIG. 3A by the placement of a dot at one end of the winding symbol. As shown, the winding sense of all the primary windings and of secondary windings 322A and 322B are the same (i.e., the dot is at the top of the winding). The winding sense of secondary winding 322C is the opposite of the others. Thus, the voltage $V_1$ on the dot side of primary winding 311 is the sum of the 18 volts at output node $V_S$ of the power supply, plus 18 volts across primary winding 312 (i.e., voltage $V_2$ on the dot side of primary winding 312 is at 36 volts), plus 36 volts across primary winding 311, equals 72 volts. Voltage $V_3$ on the dot side of primary winding 314 is at the common voltage, illustratively assumed to be zero volts. Because winding 314 is illustratively assumed to have 16 turns, the voltage across it is 36 volts. Thus, the voltage $V_4$ at the non-dot node of winding 314 is −36 volts.

Figure 4B:
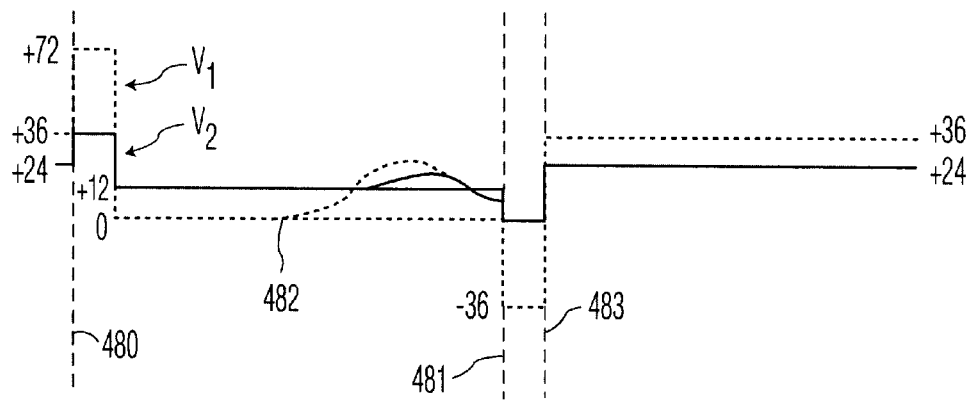
Figure 4C:
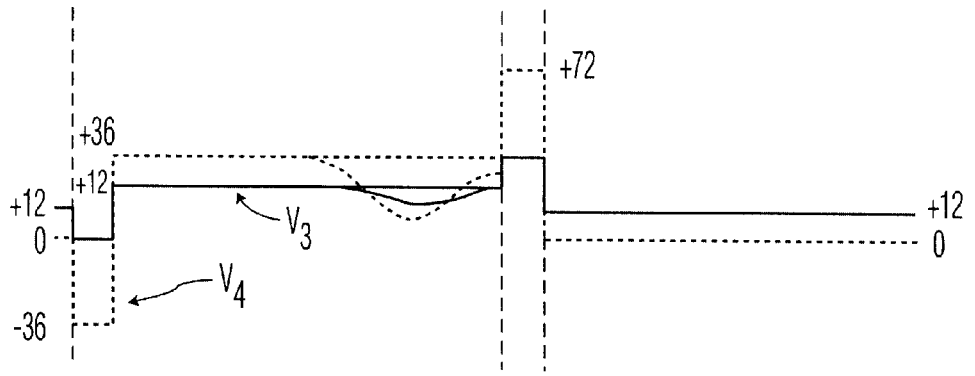
Figure 4D:
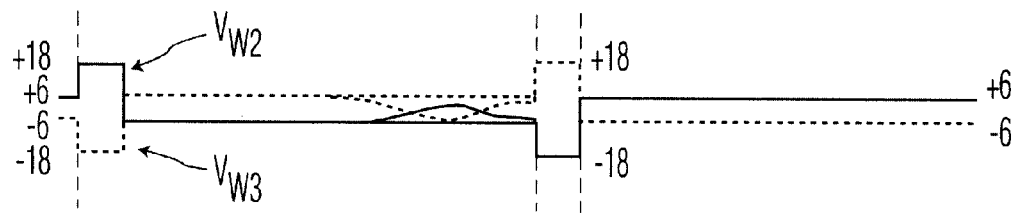
Figure 4E:
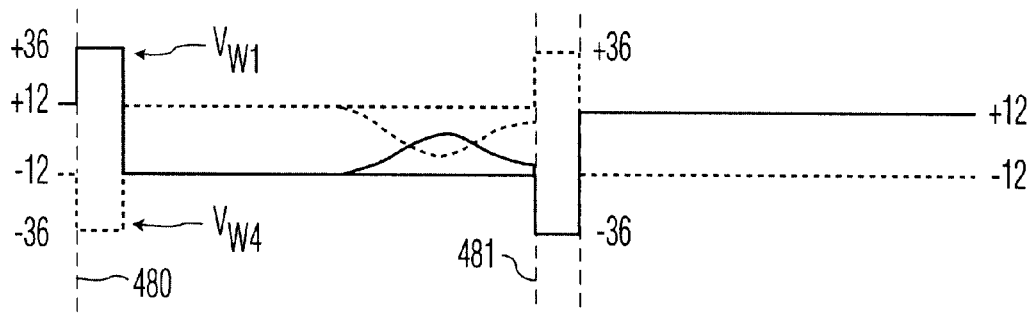

These voltage values at the nodes of the primary windings, and across the primary windings, are graphically represented in FIGS. 4B–4E. Voltages $V_1$ and $V_2$ are shown in FIG. 4B and voltages $V_3$ and $V_4$ are shown in FIG. 4C. FIG. 4D shows the voltages $V_{W2}$ and $V_{W3}$ across primary windings 312 and 313, and FIG. 4E shows the voltages $V_{W1}$ and $V_{W4}$ across primary windings 311 and 314. All of these voltages are shown in time alignment with the primary control signals shown in FIG. 4A.

Figure 4F:
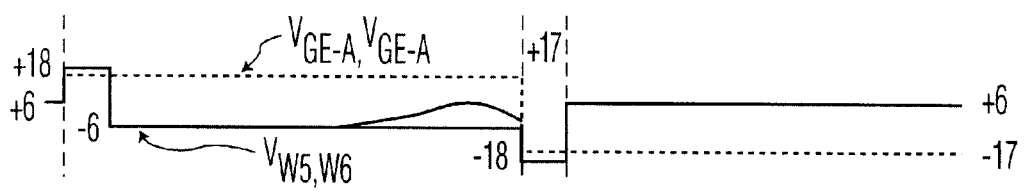
Figure 4G:
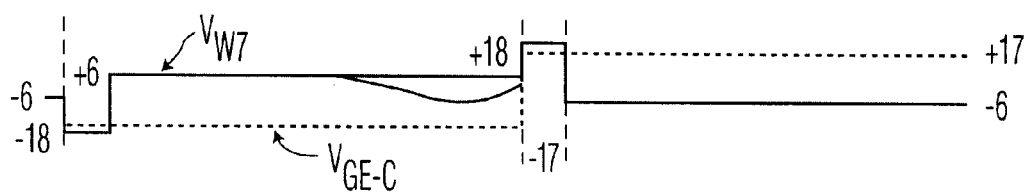

FIGS. 4F and 4G include graphical representations of the voltages magnetically induced across secondary windings 322 due to the voltage imposed across primary driven winding 313. These voltages also are shown in time alignment with the primary control signals shown in FIG. 4A. As with respect to the primary windings, initial attention is directed to the period 405. During this period, voltages $V_{W5}$ and $V_{W6}$ across secondary windings 322A and 322B, respectively, are each 18 volts, as shown in FIG. 4F. The value of 18 volts is due to the illustrative assumption that secondary windings 322A and 322B have the same number of turns as does primary driven winding 313. As shown in FIG. 4G, voltage $V_{W5}$ across secondary winding 322C is −18 volts due to the illustrative assumption that this winding also has the same number of turns as does primary driven winding 313. As noted, however, the winding sense of secondary winding 322C is opposite to those of the other windings; thus, the voltage is negative rather than positive.

The operations of the circuit elements on the secondary side of transformer 310 are now described with respect to the voltages present on secondary windings 322 during the period 405, as described above. Moreover, the description of these operations can be simplified because of the similarity of portions of the circuit on the secondary side. In particular, the circuit on the secondary side of transformer 310 consists of three similar portions. One portion, identified by the vertical dotted line 320A, is associated with secondary winding 322A in a manner to be described. Another portion, identified by vertical dotted line 320B, is associated with secondary winding 322B. A third portion, identified by vertical dotted line 320C, is associated with secondary winding 322C. Because the operations of these three portions are similar to each other, only portion 320A will be specifically described.

To aid in the description, illustrative correspondences between circuit elements of portion 320A and functional elements of FIGS. 1 and 2 are noted. It will be understood that these correspondences are provided for purposes of illustration only, and that the circuit elements could be characterized in other ways. For example, whereas resistor 324A may be described as corresponding to a portion of on-threshold and off-threshold detectors 220 and 230 of detector and driver circuit 130A, it could also be characterized as corresponding to a portion of driver 240 of circuit 130A.

Implementation of control and driving signals 122. As noted, voltage $V_{W5}$ is magnetically induced across secondary winding 322A. The values of this voltage over time constitute a voltage waveform, and thus may hereafter be referred to either as waveform $V_{W5}$ or voltage $V_{W5}$. Waveform $V_{W5}$ corresponds to control and driving signal 122A of FIGS. 1 and 2. (Similarly, waveforms $V_{W6}$ and $V_{W7}$ correspond respectively to signals 122B and 122C.)

Implementation of on-threshold detector 220. Waveform $V_{W5}$ is coupled to nodes 370 and 371, which correspond to input nodes of detector and driver circuit 130A. As noted with respect to FIG. 2, detector and driver circuit 130A includes on-threshold detector 220 and off-threshold detector 230. On-threshold detector 220 is implemented in FIG. 3A by resistor 324A, zener diode 330A, and resistor 332A. Off-threshold detector 230 is implemented by resistor 324A, zener diode 328A, and resistor 326A.

In particular, voltage $V_{W5}$ initially (i.e., during period 405) has a value of 18 volts. The positive side of the 18 volts is imposed at node 370, which is one of the nodes of resistor 324A. Resistor 324A has a small value such as, for example, 10 ohms. The purpose of resistor 324A is to dampen any high-frequency oscillations or spikes that may occur. These oscillations or spikes may be due, for example, to unintended magnetic induction from circuit elements or connectors resulting from the high-frequency switching of the circuit. The resistance is chosen to be low in order to provide that the circuit of this implementation of on-threshold detector 220 present as low an impedance as possible so that the circuit may operate at high frequencies. The negative side of the 18 volts is imposed by winding 322A at node 371, which is a common node for circuit 320A. As noted, it often is advantageous that this common node be floating; e.g., that it not be tied to common node 362 of circuit 320B on the secondary side of transformer 310 or to common node 390 on the primary side. A reason is, for example, that if node 371 were tied to node 362, the output of switching transistor 340B would be shorted and the full voltage of load 342A would be imposed across the output of switching transistor 340A. Circuit 320B would thereby be rendered essentially inoperative, and transistor 340A could be damaged.

Figure 3B:
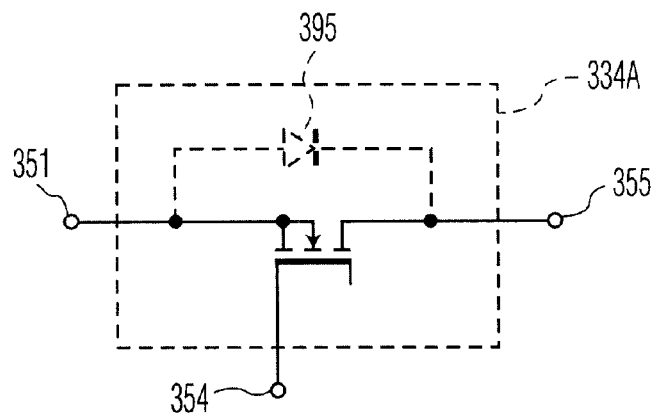
FIG. 3B is a diagram of illustrative electrical components representing aspects of the electrical characteristics of one embodiment of the driving switches of the switching circuit of FIG. 3A.

Because resistor 324A has a low value and thus drops little voltage, a voltage close to 18 volts is imposed at node 351. Essentially this same voltage is applied at node 355, on the other side of driving switch 334A, as can be seen by the simplified circuit diagram of FIG. 3B. FIG. 3B shows circuit elements representing the internal operation of driving transistor 334A and of other field-effect transistors of the illustrated circuit of FIG. 3A. As shown in FIG. 3B, driving transistor 334A can be equivalently represented as including a diode 395 connected between the source and drain of the transistor with the anode of the diode connected to the source and the cathode of the diode connected to the drain. Thus, current flows from the source to the drain of driving transistor 334A when the voltage at the source is greater than the voltage at the drain. The voltage drop from the source to the drain will be illustratively assumed, as is typical, to be small. Thus, essentially 18 volts will be applied to the gate of switching transistor 340A, provided that the circuit is completed between the gate of switching transistor 340A and the return side of the voltage across winding 322A at node 371.

As will be appreciated by those skilled in the relevant art, current flows into the gate to the emitter capacitance of transistor 340A, thereby charging the internal gate emitter capacitance (not shown) of the transistor and turning the transistor on. This capacitance holds the 18 volts across the gate to emitter for a period. It is advantageous if this period is such that transistor 340A remains on for the duration of a "cycle," i.e., until waveform $V_{W5}$ signals that transistor 340A should remain in the "on" state or that it should switch to the "off" state. For example, the period labeled 406 in FIG. 4A is the remainder of a cycle that is made up of period 405 and period 406. A second cycle is made up of periods 408 and 1407. The period hat transistor 340A remains on due to its internal gate-emitter capacitance is determined by the duration of period 405 and by the values of waveform $V_{W5}$ during period 405, the internal capacitance of transistor 340A, and the values of other circuit elements through which the voltage across the internal capacitance of transistor 340A may be discharged. In particular, the internal gate-emitter capacitance of transistor 340A may discharge through resistor 338A. The value of resistor 338A generally should be relatively large, for example 100,000 ohms. The reason is to provide that transistor 340A remains on for the extent of period 406 until another control pulse is provided in the second cycle (i.e., in period 408) that either maintains transistor 340A in the "on" state or turns it off. Resistor 338A should not be so large, however, that the internal capacitance of transistor 340A may not be discharged even when circuit 320A is not active.

The "on" state of switching transistor 340A is represented by the voltage waveform $V_{GE-A}$ (voltage from gate to emitter of switching transistor 340A) of FIG. 4F. Specifically, voltage waveform $V_{GE-A}$, having a value of about 17 volts, is representative of switching transistor 340A in the "on" state. The slight voltage drop from 18 volts to 17 volts occurs primarily across resistor 324A, the internal diode 395 of driving transistor 334A, and across the drain to source of driving transistor 336A as described below.

To complete the circuit from node 355 to node 371, driving transistor 336A must be turned on so that current may flow from its drain (node 356) to its source (node 371). If transistor 336A is not turned on, current will not flow through this path because the equivalent internal diode (analogous to diode 395 of FIG. 3B) prevents it. As is typical for some kinds of MOSFET's, it will illustratively be assumed that a voltage of 5 or 6 volts from the gate of transistor 336A to its source typically is sufficient to turn it on.

Thus, for this implementation of on-threshold detector 220 to detect an "on" state based on the voltage across secondary winding 322A, the value of the voltage at node 351 should be such as to cause driving transistor 336A to turn on and complete the connection between nodes 355 and 371 through the gate-emitter capacitance of transistor 340A and resistor 338A. This detection is effectively accomplished by zener diode 330A, although any of a number of other types of voltage-reference devices or circuits could be used in alternative implementations. Diode 330A is illustratively assumed to zener at a value of about 8 or 9 volts, which is typical for some types of zener diodes. That is, if less than 8 volts is applied from a positive value at its cathode (node 351) to its anode (node 352), then it does not conduct. In this non-conducting state, node 352 is at zero volts; i.e., at the same voltage as node 371. If greater than 8 or 9 volts is applied from node 351 to node 352, then diode 330A conducts and maintains a voltage across it of approximately 8 or 9 volts. This drop in voltage typically increases somewhat as the current through the diode increases, so it may be illustratively assumed that the voltage drop across zener diode 330A is about 9 volts when node 351 is at about 18 volts. The drop across resistor 332A is thus also about 9 volts. The value of resistor 332A is illustratively assumed to be about 10,000 ohms. This value may be chosen, in accordance with techniques known by those skilled in the relevant art, to limit the current flowing through zener diode 330A so that it is not damaged, while providing sufficient current to cause the diode to switch to its zener state quickly.

When zener diode 330A is conducting, the voltage from the gate to source of driving transistor 336A is about 9 volts. This value typically is more than sufficient to turn transistor 336A on, complete the circuit between nodes 355 and 371 through the gate-emitter capacitance of transistor 340A and through resistor 338A, and thus turn switching transistor 340A on. Voltage $V_{W5}$ therefore serves as a control signal such that, at a value of 18 volts as in the present illustration, on-threshold detector 220 detects an "on" state. It will be understood that many other values of $V_{W5}$ could be employed in the illustrated, or other, implementations of detector 220. Notably, voltage $V_{W5}$ also serves as the driving signal that drives switching transistor 340A on.

Advantageously, energy stored in the core of transformer 310 during period 405 is returned to the power supply during period 406 due to the timing of the opening and closing of switches 301–304 and the particular configuration of current paths that are provided or removed by the opening and closing of those switches. As noted above, the core of transformer 310 could become saturated if energy is not removed from the core, resulting in damage to the primary transistor switch 303 and possibly to other components of the circuit of FIG. 3A. One arrangement for opening and closing switches 301–304 is now described with reference to FIGS. 3A, 4A, and 5. It will be understood, however, that this arrangement is illustrative only and that many variations are possible.

As shown in FIG. 4A, controller 110 is illustratively assumed to operate so that primary control signal 403 is low during period 406. That is, switch 303 is in the "off" state, or open, during period 406. When switch 303 changes from closed to open at the transition between periods 405 and 406, the current path described above from the voltage source at ode $V_S$, through primary driven winding 313, through switch 303, to common voltage 390 is interrupted. The magnetic field in primary driven winding 313 therefore collapses. As will be appreciated by those skilled in the relevant art, the collapsing of the magnetic field causes the voltage across primary driven winding 313 to reverse (or, as is sometimes said, to "fly back") so that, while the voltage at node $V_S$ on the dot side of winding 313 remains at 18 volts, voltage $V_3$ on the non-dot side of winding 313 rapidly rises. If voltage $V_3$ is not clamped, and depending on the amount of energy stored in the transformer core, that voltage could increase to levels that would damage switch 303 and possibly other components. Many known techniques, devices, and circuits could be used to clamp voltage $V_3$. For example, so-called "snubber" circuits, typically including resistive-capacitive (RC) components, could be used to absorb the energy from the collapsed magnetic field. A variety of active clamping circuits also are known that employ diodes, transistor switches, and other components to provide paths through which the energy may dissipate. As an additional non-limiting example, resonant circuits could be used to temporarily store the energy and then return it to the power supply in a safe manner.

Another technique for clamping voltages in a transformer is to employ a clamp winding. This technique will now be described with reference to the illustrative circuit of FIG. 3A. In alternative implementations, any of the previously mentioned or other known clamping techniques, ones to be developed in the future, or combinations thereof, could be used. In FIG. 3A, primary windings 311 and 312 constitute the clamp windings. Specifically, as the voltage across winding 313 flies back, that same voltage as instantaneously exists across winding 313 is magnetically coupled to winding 312 because it is illustratively assumed that windings 313 and 312 both have the same number of turns, which is eight turns in the present example. Similarly, twice the voltage across winding 313 is coupled to winding 311 because it is illustratively assumed that winding 311 has 16 turns, as noted above. Thus, three times the voltage across winding 313 is coupled across the series combination of windings 311 and 312. As shown in FIG. 4A, switches 302 and 304 are open and switch 301 is closed during period 406. This combination of settings provides a second current path (as distinguished from the first current path active during period 405) from common voltage 390, through switch 301, diode 305, winding 311, and winding 312, to the return of the power supply, node $V_S$. Node $V_S$ is at 18 volts, and it may illustratively be assumed that the common voltage 390, to which both the power supply and switch 301 are connected, is at ground, or zero volts. That is, the closing of switch 301 provides that the dot side of winding 311 is clamped to ground through switch 301 while the non-dot side of winding 312 is held at 18 volts. Thus, the voltage across the series combination of windings 311 and 312, having a total of 24 turns (16 turns for winding 311 and eight turns for winding 312) is 18 volts. The voltage across primary driven winding 313 is thus clamped at one-third of that voltage, i.e., 6 volts, because winding 313 has eight turns, or one-third the number of turns of the combination of windings 311 and 312. Voltage $V_3$ on the non-dot side of winding 313 therefore is clamped and switch 303 is protected.

In addition to clamping $V_3$ to 24 volts (18 volts plus 6 volts), the second current path also enables the energy stored in the magnetic field during period 405 to return to the power supply during period 406. The duration of periods 405 and 406 are determined so that all of the energy provided through primary driven winding 313 to the transformer core can be returned to the power supply, thus avoiding saturation of the core of transformer 310. In particular, the magnetic flux generated by primary driven winding 313 during period 405 is proportional to the integral of the instantaneous voltages across that winding over the duration of period 405. Magnetic energy is proportional to the square of magnetic flux. For convenience and to preserve generality, time duration is hereafter referred to in reference to one "cycle," consisting of the duration of period 405 plus the duration of period 406. It is assumed for illustrative purposes that period 405 is 0.1 cycles and that period 406 is 0.9 cycles. In the example illustrated by FIGS. 3A and 4A–4G, a voltage pulse of substantially constant amplitude, i.e., 18 volts, is impressed across primary driven winding 313 for the duration of period 405. Thus, the magnetic flux generated by winding 313 and stored in the core of transformer 310 during period 405 is proportional to 18 volts times 0.1 cycles. As just described above, the voltage across winding 313, also across winding 312, during period 406 is 6 volts (one-third of the 18 volts clamped between voltage $V_S$ and common voltage 390). Thus, the magnetic flux that may be removed from the transformer core during period 406 is proportional to 6 volts times 0.9 cycles, which exceeds the amount of magnetic flux generated during period 405.

Although period 406 might be determined to be as short as 0.3 cycles (18 volts for 0.1 cycles equals 6 volts for 0.3 cycles) to provide that the magnetic flux be removed under ideal conditions, the additional time is provided to ensure that all of the energy is in fact removed and returned to the power supply during operating conditions. As shown in FIGS. 4B–4G, the voltages across the primary and secondary windings oscillate during the latter part of period 406. These oscillations occur because of energy stored in leakage inductances in the primary and secondary circuits combined with the stray capacitances of the primary and secondary windings. That is, for example, period 406 is sufficiently long in these illustrative figures that substantially all of the energy in the core of transformer 310 has been removed from the core by the point at which the oscillations occur, such as point 482 in FIG. 4B. These oscillations gradually dampen. For clarity of illustration, these oscillations are not shown in the portions of FIGS. 4B–4G during the second illustrative cycle of periods 408 and 407 to be described below. It will be understood, however, that these oscillations typically occur during the second cycle for the same reasons, and in the same manner, as just described with respect to period 406 of the first cycle. It will also be understood that the first and second cycles shown in FIGS. 4A–4G are illustrative only and that any number of cycles may occur.

A related design consideration involves the duration of period 405. The magnetic energy stored in the core of transformer 310 during period 405 is proportional to the number of turns on primary driven winding 313, the duration of period 405, and the voltages impressed on winding 313 during this period. In particular, the energy increases as the numbers of turns, the value of voltage, and/or the duration of period 405, increase. If one or more of these factors is too large, the core of transformer 310 may saturate during period 405 so that the return of energy during period 406 comes too late to avoid damage to the primary transistor switch 303 and malfunction of transformer 310. Thus, it generally is desirable to minimize these factors for this reason, as well as, with respect to the number of turns, to reduce leakage impedance as noted above. However, in terms of the present illustrative example, the time the primary driven winding 313 is driven during period 405 should be sufficient to provide that control and driving signal 122A (i.e., voltage $V_{W5}$) on the secondary side of transformer 310 imparts enough energy to charge the gate-emitter capacitance of switching transistor 340A so that it remains on during period 406, as described above. Therefore, the duration of period 405, and thus of period 406 to avoid saturation, are also determined by the gate-emitter capacitance of switching transistor 340A (and of the other switching transistors 340) and the value chosen for resistor 338A. Assuming a typical value of gate-emitter capacitance of 2000 picofarads plus any effective miller capacitance, and a resistance of 100,000 ohms for resistor 338A, period 405 may be chosen to be, for example, about one microsecond and period 406 may be chosen to be about nine microseconds.

Switching transistor 340A is neither driven on nor driven off during period 406 although, as noted, sufficient charge is deposited on the gate-emitter capacitance of switching transistor 340A during period 405 for it to remain on during period 406. The reason that transistor 340A is neither turned on nor off is due to the selection of the number of turns of the primary and secondary windings. For example, it was noted above that 18 volts is clamped across primary windings 312 and 311 during period 406. In particular, the dot side of winding 312 is six volts less than the non-dot side of that winding, with the remaining 12 volts being dropped across winding 311 because it has twice as many turns as winding 312. Secondary winding 322A is illustratively assumed to have the same number of turns as primary winding 312 (i.e., eight turns in this example). Therefore, voltage $V_{W5}$ is negative six volts as measured under the convention, as noted in FIG. 3A, that the positive side of winding 322A is the dot side. As will be appreciated from the previous description of the operation of on-threshold detector 220 as exemplified by zener diode 330A and other components, a negative voltage will not activate zener diode 330A or transistor 336A. Switching transistor 340A thus will not be driven on by voltage $V_{W5}$ during period 406 (although transistor 340A remains on). Furthermore, while the voltage is of the proper polarity to activate the off-threshold detector 328A and 334A, it is below the eight-volt zener threshold.

Implementation of off-threshold detector 230. The value of voltage $V_{W5}$ of negative six volts is not sufficient to drive switching transistor 340A off during period 406. This result follows from the operations of off-threshold detector 230 as implemented in the illustrative circuit 320A by resistor 324A, zener diode 328A, and resistor 326A. The operations of this implementation of off-threshold detector 230 are analogous to the operations described above with respect to the illustrative implementation of on-threshold detector 220. More specifically, the operations are the same except that off-threshold detector 230 responds to negative values of voltage $V_{W5}$ in the same manner as on-threshold detector 220 responds to positive values of voltage $V_{W5}$.

In particular, for this implementation of off-threshold detector 230 to detect an "off" state based on the voltage across secondary winding 322A, the value of the voltage at node 371 should be such as to cause driving transistor 334A to turn on and complete the connection between nodes 301 and 355 through the gate-emitter capacitance of transistor 340A and resistor 338A. This detection is effectively accomplished by zener diode 328A, although any of a number of other types of voltage-reference devices or circuits could be used in alternative implementations. Like diode 330A, diode 328A is illustratively assumed to zener at a value of about 8 or 9 volts. That is, if a voltage having a magnitude less than 8 volts is applied from a positive value at its cathode (node 371) to its anode (node 354), then it does not conduct. During period 406, the voltage at node 371 is of a magnitude six volts greater than the voltage at node 354. That is, as noted above, voltage $V_{W5}$ is negative six volts. In this non-conducting state, node 354 is at minus six volts with respect to node 371; i.e., node 354 is at the same voltage as node 351. Driving transistor 334A thus is not turned on and the negative six volts at node 351 is not applied to switching transistor 340A to turn if off.

In contrast, the configuration of switches 301–304 during period 408, which is the initial part of cycle 2 as referred to herein, does cause control and driving signal 122A to assume an "off" state that is detected by off-threshold detector 230. As shown in FIG. 4A, switches 303 and 301 are open during period 408 and switches 302 and 304 are closed. This arrangement is thus the opposite of the configuration during period 405 in which switches 303 and 301 are closed and switches 302 and 304 are open. For reasons analogous to those described above with respect to period 405 and thus not repeated in detail, voltage $V_{W2}$ across primary winding 312 is negative 18 volts during period 408. That is, negative 18 volts are impressed upon winding 312 based on the polarity convention shown in FIG. 3A in which the positive reference is on the dot side of the winding. Winding 312 thus is the primary driven winding during period 408.

Due to magnetic coupling, negative 18 volts are induced across secondary winding 322A during period 408. That is, voltage $V_{W5}$ has a value of negative 18 volts during this period, as shown in FIG. 4F. Thus, because a voltage differential of more than positive 9 volts is applied from node 371 to node 354, diode 328A conducts and maintains a voltage across it of approximately 9 volts. The drop across resistor 326A is thus also about 9 volts. For reasons noted above, the value of resistor 326A is illustratively assumed to be about 10,000 ohms.

When zener diode 328A is conducting, the voltage from the gate to source of driving transistor 334A is about 9 volts. This value typically is more than sufficient to turn transistor 334A on, complete the circuit between nodes 371 and 351 through the gate-emitter capacitance of transistor 340A and through resistor 338A, and thus apply voltage $V_{GE-A}$ having a value of about negative 17 volts to drive switching transistor 340A off. The drop in magnitude from negative 18 volts to negative 17 volts occurs primarily across resistor 324A, the internal diode of driving transistor 336A, and across the drain to source of driving transistor 334A. Voltage $V_{W5}$ therefore serves as a control signal such that, at a magnitude of negative 18 volts as in the present illustration, off-threshold detector 230 detects an "off" state. It will be understood that many other values of $V_{W5}$ could be employed in the illustrated, or other, implementations of detector 230. Notably, voltage $V_{W5}$ also serves as the driving signal that drives switching transistor 340A off.

For the same reason of avoiding saturation as described above, energy stored in the core of transformer 310 during period 408 is returned to the power supply during period 407. In addition, the voltage at the primary driven winding is clamped. The manners in which these objectives are accomplished are analogous to those described above with respect to period 406. Specifically, as shown in FIG. 4A, controller 110 is illustratively assumed to operate so that primary control signal 402 is low during period 407. That is, switch 302 is opened at the transition between periods 408 and 407 and the current path from the voltage source at node $V_S$, through primary driven winding 312, through switch 302, to common voltage 390 is interrupted. The magnetic field in primary driven winding 312 therefore collapses, causing the voltage across it to fly back. As the voltage across winding 312 flies back, that same voltage is magnetically coupled to winding 313 because it is illustratively assumed that windings 312 and 313 both have eight turns. Twice the voltage across winding 312 is coupled to winding 314 because it is illustratively assumed that winding 314 has 16 turns, as noted above. Thus, three times the voltage across winding 312 is coupled across the series combination of windings 313 and 314 (the clamp windings). As shown in FIG. 4A, switches 301 and 302 are open and switch 304 is closed during period 407. This combination of settings provides a second current path (as distinguished from the first current path active during period 408) from common voltage 390, through switch 304, diode 306, winding 314, and winding 313, to the return of the power supply. Thus, the voltage across the series combination of windings 314 and 313, having a total of 24 turns, is negative 18 volts. The voltage across primary driven winding 312 is thus clamped at one-third of that voltage, i.e., positive six volts above $V_S$ or plus 24 volts, because winding 312 has eight turns. Voltage $V_2$ on the dot side of winding 312 therefore is clamped and switch 302 is protected.

The duration of periods 408 and 407 are determined in the same manner as described above with respect to period 405 and 406 so that all of the energy provided through primary driven winding 312 to the transformer core can be returned to the power supply, thus avoiding saturation of the core of transformer 310. The importance of these determinations of the relative durations of periods 405 and 406 in the first cycle and of the analogous periods 408 and 407 in the second cycle (and of any number of successive cycles) can be appreciated by assuming for illustrative purposes that only a portion of the energy stored in the core of transformer 310 during period 405 had been returned to the power supply during period 406. Assuming this same partial removal of energy from the core during successive cycles, the residual energy remaining in the core would build up during successive cycles until the core eventually saturated. The problem of saturation is particularly acute in transformers, such as illustrative transformer 310 of the present example, in which the number of turns in the windings is minimized to reduce inductance and thus enable rapid switching. The number of turns may thus be chosen to be quite small, such as the eight or 16 turns of the present example, because inductance in a winding increases in proportion to the square of the number of turns. However, this low inductance means that current will increase very rapidly in the windings when a voltage pulse is applied to the primary driven winding, and substantial amounts of energy will thus be stored in the transformer core with each voltage pulse.

Saturation of the core could alternatively be avoided if the direction of current through the driven primary windings were required to alternate between each successive cycle. That is, for example, switching transistor 340A would be driven on in one cycle, off in the next cycle, on in the next cycle, and so on. Thus, whereas one cycle would store energy in the core, the successive cycle would draw it out. However, the method of avoiding saturation described above with respect to the illustrative implementation of FIGS. 4A–G avoids this requirement of alternating on-off cycles. In particular, various implementations of this method allow for switching transistor 340A to be in the "on" state for an indefinite period as well as rapidly to be switched between the "on" and "off" states in any order. Also, rather than stacking successive "on" or "off" cycles, an "on" cycle could be interrupted early by an "off" cycle, or vice versa. That is, before its reset period when energy is returned to the power supply is completed. This circumstance would not result in saturation of the transformer core because the drive of the "off" cycle would be in the direction opposite to that of the drive of the "on" cycle, thus acting to remove energy from the core even without the completion of the reset period. Thus, pulse width modulation is possible.

As those skilled in the relevant art will readily appreciate, circuits 320B and 320C operate in substantially the same manner as is described above with respect to the operations of circuit 320A. One difference, however, is that the connections of the outputs of circuits 320A, 320B, and 320C differ somewhat. Specifically, two loads presenting high voltages (hereafter, simply "loads") are shown in FIG. 3A. Load 342A corresponds to high voltage and load 190A of FIG. 1, and load 342B corresponds to high voltage and load 190B of FIG. 1. Switching transistors 340A and 340B are connected in series to stand off the high voltage of load 342A and to switch it. Transistor 340C alone stands off and switches load 342B. Another difference among circuits 320 is that the winding sense of secondary winding 322C is opposite to that of secondary windings 322A and 322B. Thus, as will also be readily appreciated by those skilled in the relevant art, circuits 320A, 320B, and 320C respectively switch switches 340A, 340B, and 340C at substantially the same time. This same-time type of synchronous switching occurs because voltages induced by either primary driven winding 313 (during the "on" state as described above) or primary driven winding 312 (during the "off" state as described above) are magnetically coupled at substantially the same time to each of the three illustrative secondary windings 322. However, because the sense of winding 322C is opposite to that of the other two secondary windings, switching transistor 340C is switched off when switching transistors 340A and 340B are switched on, and vice versa. That is, while transistors 340A and 340B switch synchronously in-phase with each other, transistor 340C switches synchronously out-of-phase with the other two. In similar manners, any number of secondary windings 322 and corresponding switching transistors 340 could be connected so that various combinations of transistors 340 would switch on or off synchronously, either alone or in combinations, and either in-phase or out-of-phase, with others of transistors 340.

Figure 5:
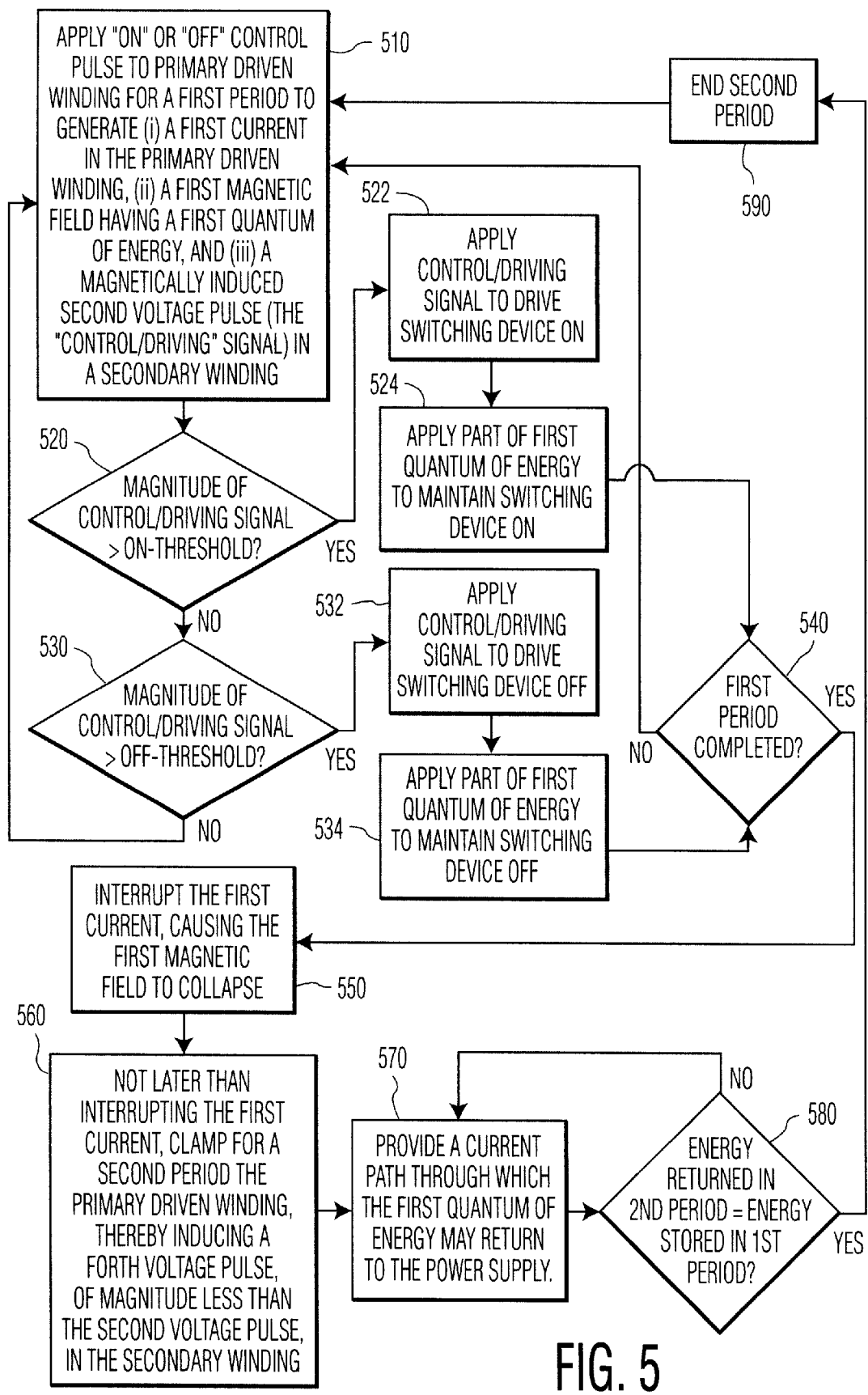
FIG. 5 is simplified flow chart of one illustrative method of operating one embodiment of a controller of the switching circuit of FIG. 1, such as by implementing the control signals of FIG. 4A.

The Illustrative Method of FIG. 5

FIG. 5 is a simplified flow chart summarizing the principal steps and decision elements described above with respect to the method of control of switches 301–304 shown in FIGS. 4A–4G. The method of FIG. 5 is illustrative only and not limiting. Step 510 represents the step of controlling switches 301–304 so that a control pulse representing either an "on" state or an "off" state is applied to a primary driven winding. The application in step 510 of either an "on" or "off" state pulse (or other waveform) causes a quantum of energy to be stored in the core of transformer 310.

For example, a voltage pulse having a constant amplitude of negative 18 volts over the period 405 is shown in FIG. 4D as part of voltage waveform $V_{W3}$. As described above, this voltage pulse generates a current in primary driven winding 313 that induces a voltage pulse of positive 18 volts across secondary windings 322A and 322B, as represented in FIG. 4F by the portions of waveforms $V_{W5}$ and $V_{W6}$ that occur during period 405. These voltage pulses across secondary windings 322A and 322B respectively constitute portions of control and driving signals 122A and 122B that respectively convey the "on" state information with respect to circuit 320A and 320B. As noted above, the corresponding portion of waveform $V_{W7}$ conveys "off" state information with respect to circuit 320C. Similarly, a voltage pulse having a constant amplitude of negative 18 volts over the period 408 is shown in FIG. 4D as part of voltage waveform $V_{W2}$. As described above, this voltage pulse generates a current in primary driven winding 312 that induces a voltage pulse of negative 18 volts across secondary windings 322A and 322B, as represented in FIG. 4F by the portion of waveforms $V_{W5}$ and $V_{W6}$ that occur during period 408. These voltage pulses across secondary windings 322A and 322B respectively constitute portions of control and driving signals 122A and 122B that respectively convey the "off" state information with respect to circuit 320A and 320B. The corresponding portion of waveform $V_{W7}$ conveys "on" state information with respect to circuit 320C.

In the case either of an "on" or "off" state, any of control and driving signals 122 need not be a pulse of constant amplitude as shown in the illustrative example. Rather, either state may be conveyed by any set of voltages, i.e., a waveform of any shape, over the periods 405 or 408 such that the state may be detected by detectors 220 or 230. It will be understood that, in alternative embodiments, other configurations and/or other numbers of switches may be employed, and/or the current-control or voltage-control functions implemented by switches 301–304 could be implemented by devices or circuits in addition to or other than switches.

Decision element 520 represents a determination whether the magnitude of control and driving signals 122 are detected (by on-threshold detector 220 in the illustrated example) to represent an "on" state. Similarly, decision element 530 represents a determination whether the magnitude of control and driving signals 122 are detected (by off-threshold detector 230 in the illustrated example) to represent an "off" state. Although voltage magnitudes are used in the above-illustrated examples of implementations of on-threshold detector 220 and off-threshold detector 230, other measures may be used in alternative implementations. For example, an amount of charge, energy, or current, provided or caused by control and driving signals 122 may be employed.

Steps 522 and 532 represent applying control and driving signals 122 to switching devices 340 to drive them on or off, respectively, responsive to whether signals 122 are detected to convey "on" or "off" state information by on-threshold detector 220 or off-threshold detector 230. Steps 524 and 534 respectively represent applying a quantum of energy provided by control and driving signals 122 to the gate-emitter capacitances of switching devices 340 to maintain them in the on or off conditions. Decision element 540 represents the action of controller 110 in determining whether the first period (energy stored and switching transistors driven) is to be terminated and the second period (energy removed and switching transistors maintained in driven state) begun.

In step 550, controller 110 causes the current path through either primary driven winding 313 or primary driven winding 312 (depending on whether an "on" or "off" state is being conveyed, respectively) to be interrupted. The magnetic field generated by the corresponding primary driven winding therefore collapses. In step 560, the primary driven winding is clamped during a second period so that transformer 310 and components coupled to it are protected. In addition, because of the clamping, the voltages magnetically coupled to secondary windings 322 in the second period are less than the voltages coupled to them during the first period. The difference is such that detectors 220 or 230 do not detect the "on" or "off" states, respectively, and switching transistors 340 are not driven (as contrasted with "maintained") on or off, respectively.

Step 570 corresponds to the above-described operation of providing a second current path so that the energy stored in the core of transformer 310 may be returned to the power supply. Although this second current path generally should be provided no later than interrupting the first current path, it may be provided earlier than this interruption. Also, in some implementations, the second current path could be provided later than interrupting the first current path if the rapid rise of voltage across the primary driven winding is determined not to be likely to damage components on the primary or secondary side of transformer 310, or if other clamping or protection methods are used.

Decision element 580 corresponds to the operation of controller 110 in determining whether the second period is long enough to enable the energy stored in the core of transformer 310 to return to the power supply. In some implementations, this determination may be calculated or otherwise predetermined based, in part, on the length of the first period. When the second period has extended for a sufficient amount of time, it is ended (step 590) and another first period may be initiated (step 510) in which either an "on" or "off" state is established by primary control signals 112 and, by magnetic induction, conveyed to the secondary side of transformer 310 by control and driving signals 122.

Alternatively, as indicated by decision element 585, the reset period during which energy returns to the power supply may be cut short by a control pulse of opposite polarity, as described above, driving the switching device in an opposite direction. That is, an "on" cycle could be interrupted by an "off" cycle, or vice versa.

In the preceding examples based on the circuit of FIG. 3A, transformer 310 has four primary windings, 311–314. Two of those primary windings, 313 and 312, serve as primary driven windings and the other two, together with windings 313 and 312, serve as clamp windings. As noted, however, this configuration and use of primary windings is only one of numerous possible examples, as will be appreciated by those skilled in the relevant art in view of the preceding description.

Figure 3C:
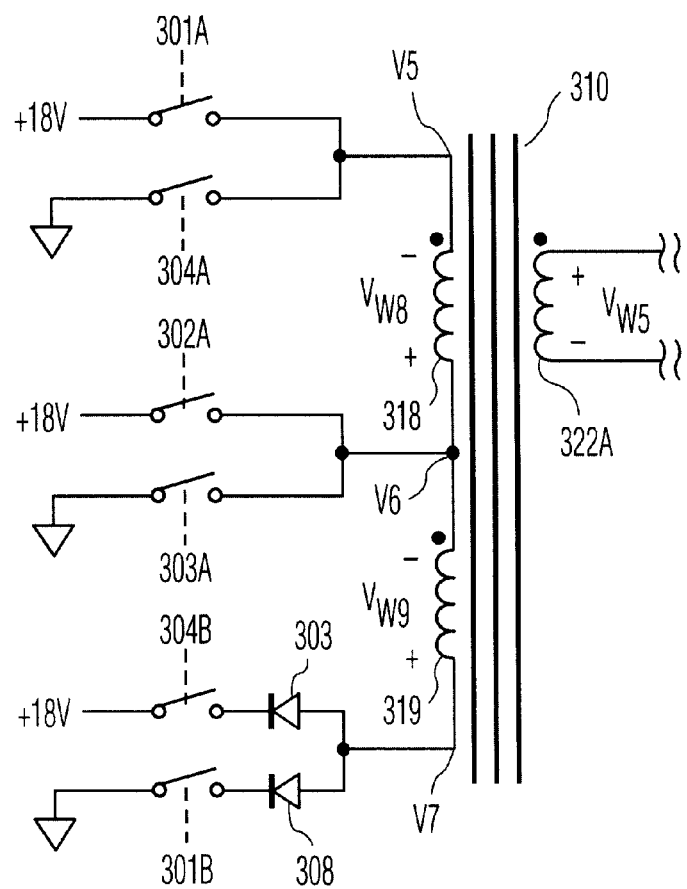

Another illustrative example of a primary winding configuration is now described with respect to FIG. 3C. For clarity and convenience of illustration, FIG. 3C shows a simplified circuit diagram of the circuit on the primary side of transformer 310, but only one representative secondary winding, winding 322A, on the secondary side. However, it may be assumed for illustrative purposes that the circuit on the secondary side in FIG. 3C is the same as the circuit on the secondary side as shown in FIG. 3A.

An advantage of the configuration of FIG. 3C compared to that of FIG. 3A is that fewer primary windings are used, thus generally reducing the size of transformer 310 and the cost of producing it. Other advantages include improved magnetic coupling and ease of providing dielectric material between the windings. The primary windings of transformer 310 in the example of FIG. 3C are identified as windings 318 and 319, and the voltages across them are labeled $V_{W8}$ and $V_{W9}$, respectively. Windings 318 and 319 correspond respectively to windings 313 and 314 of FIG. 3A. That is, the control signals and waveforms of FIGS. 4A–4G applicable to windings 313 and 314 also generally are descriptive of the operation of windings 318 and 319, respectively. As with windings 313 and 314, it will be assumed for illustrative purposes that winding 318 has eight turns and that winding 319 has 16 turns. The secondary windings in FIG. 3C have the same number of turns described above with respect to the circuit of FIG. 3A. In particular, secondary winding 322A has eight turns.

The circuit of FIG. 3C includes six switches: 301A, 301B, 302A, 303A, 304A, and 304B. It is assumed for clarity and convenience of illustration that the primary control signals applied to switches 301A and 301B are the same as the primary control signal (signal 401 of FIG. 4A) applied to switch 301 of FIG. 3A. Similarly, the primary control signals applied by controller 110 to switches 304A and 304B are assumed to be the same as the primary control signal (signal 404) applied to switch 304. The primary control signal applied to switch 302A is assumed to be the same as the primary control signal (signal 402) applied to switch 302, and the primary control signal applied to switch 303A is assumed to be the same as the primary control signal (signal 403) applied to switch 303. Although switches 301–304 are represented in FIG. 3C by simple switch symbols, it will be understood that they may be implemented in accordance with any of a variety of known techniques, such as by using active transistor switches and associated conventional switching circuits.

As indicated by the control signals shown in FIG. 4A, switches 303A and 301A and B are closed, and switches 302A and 304A and B are open, during initial period 405. The node identified by voltage $V_5$ (referred to for convenience as node $V_5$) on the dot side of winding 318, is thus connected through switch 301A to a voltage supply (not shown) providing an illustrative voltage of 18 volts. Node $V_6$, on the non-dot side of winding 318, is connected through switch 303A to the common voltage, which may illustratively be assumed to be ground. Voltage $V_{W8}$ across winding 318 thus is negative 18 volts during period 405 (i.e., voltage $V_5$ is 18 volts and voltage $V_6$ is zero volts). Voltage $V_{W9}$ across winding 319 is negative 36 volts during period 405 because it has twice the number of turns as winding 318. The dot side of winding 319 is connected through switch 303A to ground. The non-dot side is not connected to ground, even through switch 301B is closed, because diode 308 is reverse biased.

Winding 318 serves as the primary driven winding and induces 18 volts across secondary winding 322A during period 405. Thus, for the reasons described above with respect to the operations of circuit 320A, switching transistor 340A is driven on during period 405.

Similar to the process described above with respect to FIG. 3A, the energy stored in the core of transformer 310 of the circuit of FIG. 3C during period 405 is returned to the power supply during period 406. In particular, controller 110 is illustratively assumed to operate so that primary control signal 403 is low during period 406 so that switch 303A is open during that period. Switches 302A and 304A and B remain open during period 406, and switches 301A and B remain closed. When switch 303A changes from closed to open at the transition between periods 405 and 406, the current path from the power source, through switch 301A and winding 318, to ground through switch 303A is interrupted and the magnetic field in primary driven winding 318 collapses. As noted above, the collapse of the magnetic field causes the voltage across winding 318 to "flyback" so that while the voltage at node $V_5$ remains at 18 volts, the voltage at node $V_6$ would be driven to a large positive value if that node were not clamped. Clamping is accomplished in this illustrative circuit because the non-dot side of winding 319 is clamped to ground through switch 301B. Thus, the combination of windings 318 and 319 serve as the clamp winding. The energy stored in the core of transformer 310 during period 405 returns through switch 301A, windings 318 and 319, diode 308, and switch 301B to the power supply during period 406. The durations of period 405 and 406 may be determined in accordance with the considerations described above in relation to the operation of the circuit of FIG. 3A.

During period 406, the voltage from node $V_5$ (connected to the 18-volt power supply through switch 301A) to node $V_7$ (connected to ground through switch 301B) is 18 volts. Because this voltage is imposed across a total of 24 turns (eight turns in winding 318 and 16 turns in winding 319), the voltage across winding 318 is one-third of 18 volts, or six volts. Therefore, the voltage across secondary winding 322A (also having eight turns) is also six volts during period 406. Thus, for the reasons described above with respect to the operations of illustrative circuit 320A, switching transistor 340A is neither driven on nor driven off during period 406. Rather, transistor 340A remains on due to the charge deposited on its gate-emitter capacitance.

A subsequent cycle, consisting of periods 408 and 407, is now considered in which switching transistor 340A may be driven off. Switches 303A and 301A and B are open, and switches 302A and 304A and B are closed, during period 408. Node $V_6$ on the non-dot side of winding 318 is thus connected through switch 302A to the voltage supply, and node $V_5$ on the dot side of winding 318 is connected, through switch 304A, to ground. Thus, voltage $V_{W8}$ across winding 318 is 18 volts during period 408. Voltage $V_{W9}$ across winding 319 is 36 volts during period 408 because it has twice the number of turns as winding 318. Although switch 304B is on at this time, the positive voltage at node $V_7$ reverse biases diode 307 so that no current flows through this winding at this time. The voltage across winding 318 during period 408 thus is of the opposite polarity to that across the winding during period 405 (when, as noted, voltage $V_6$ was zero volts and voltage $V_5$ was 18 volts). Therefore, winding 318 also serves as the primary driven winding during period 408 and induces negative 18 volts across secondary winding 322A during that period. Thus, for the reasons described above with respect to the operations of circuit 320A, switching transistor 340A is driven off during period 408.

The energy stored in the core of transformer 310 during period 408 is returned to the power supply during period 407. Primary control signal 402 is low during period 407 so that switch 302A is open during that period. Switches 303A and 301A and B remain open during period 407, and switches 304A and B remain closed. When switch 302A changes from closed to open at the transition between periods 408 and 407, the current path from the power source, through switch 302A and winding 318, to ground through switch 301A is interrupted and the magnetic field in primary driven winding 318 collapses, causing the voltage across winding 318 to fly back. The voltage at node $V_5$ remains at zero volts, but the voltage at nodes $V_6$ and $V_7$ would be driven to large negative values if those nodes were not clamped. Clamping is accomplished because the non-dot side of winding 319 is clamped to 18 volts through switch 304B. Thus, the combination of windings 318 and 319 serve as the clamp winding, and the energy stored in the core of transformer 310 during period 408 returns through switch 304B, diode 307, windings 319 and 318, and switch 304A to the power supply during period 407. The durations of period 408 and 407 may be determined in accordance with the considerations described above in relation to the operation of the circuit of FIG. 3A.

During period 407, the voltage from node $V_7$ (connected to the power supply through switch 304B) to node $V_5$ (connected to ground through switch 304A) is positive 18 volts. Because this voltage is imposed across a total of 24 turns, the voltage across winding 318 is six volts. Therefore, the voltage $V_{W5}$ across secondary winding 322A is negative six volts during period 407. Thus, for the reasons described above with respect to the operations of illustrative circuit 320A, switching transistor 340A is neither driven on nor driven off during period 407. Rather transistor 340A remains off due to the charge deposited on its gate-emitter capacitance.

Figure 6:
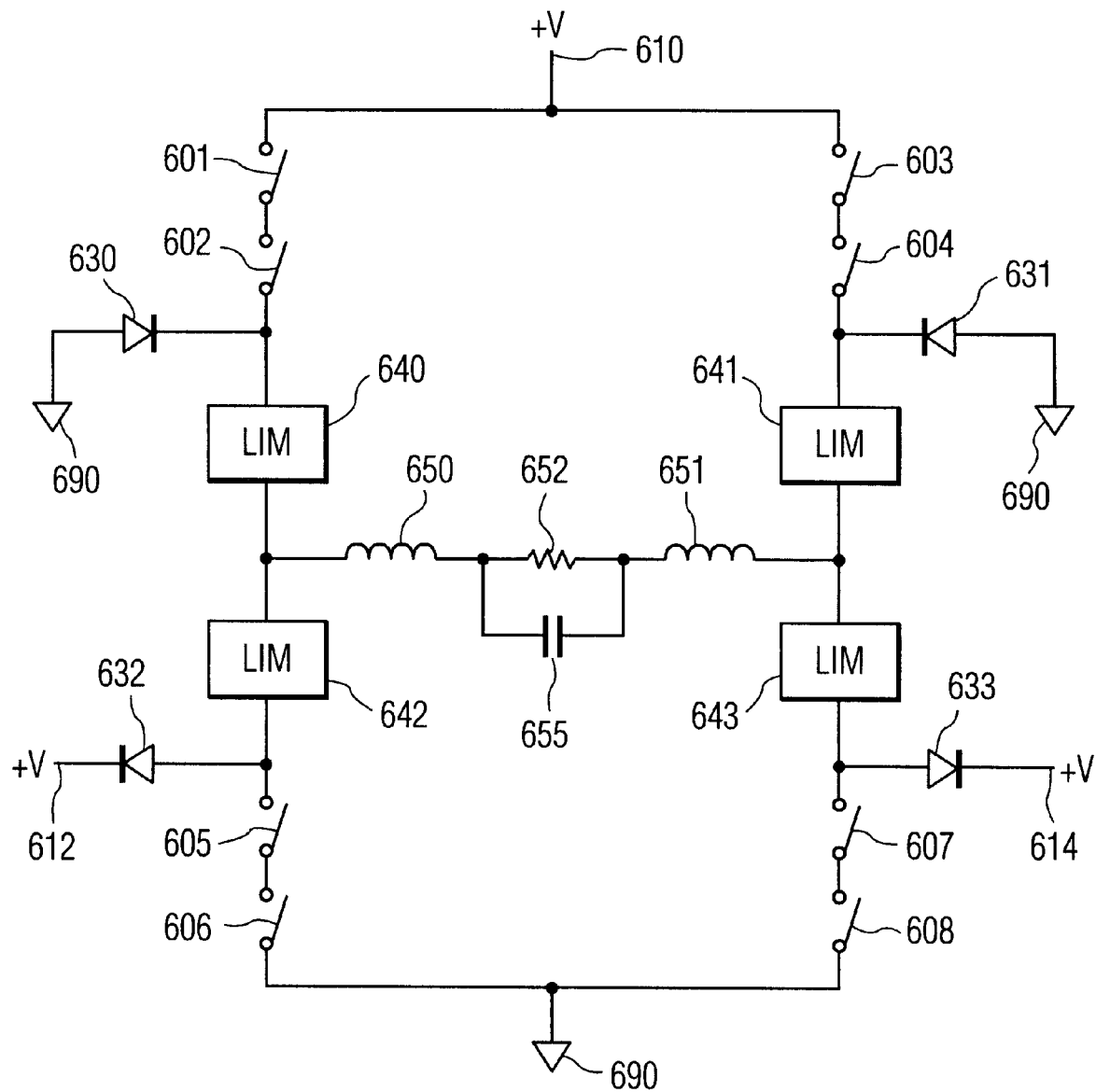
FIG. 6 is a simplified circuit diagram of an H-bridge converter for use with an amplifier that may be pulse-width modulated by using a switching circuit in accordance with the present invention, such as the switching circuit of FIG. 1.

The Illustrative Application of FIG. 6

Although references have sometimes been made above to the use of switching circuit 100 in applications involving rapid, isolated, synchronous switching of high-voltage switching devices, the circuit is not so limited. It may be used in applications in which rapid switching is not required or desired. It may be used with low-voltage switching devices. The switching of multiple switching devices need neither be synchronous nor isolated. In, particular, the example of FIG. 6 of an application in which switching circuit 100 may be used for rapid, isolated, synchronous, high-voltage switching is illustrative and non-limiting.

FIG. 6 is a simplified circuit diagram of an H-bridge converter configured for use with a conventional class D amplifier. For purposes of illustration, it will be assumed that switches 601–608 are switching devices 150 of FIG. 1 and that they are switched by switching circuit 100 (not shown in FIG. 6). For example, switches 601–608 may be switching transistors 340 of FIG. 3B, although other implementations of the present invention may also be used. The conventional H-bridge includes four selected inductance impedance limiters 640–643, each located on a leg of the bridge and coupled to the load. The load is represented by inductors 650 and 651 in series with and on either side of the parallel combination of resistor 652 and capacitance 655. The series combination of switches 601 and 602, and the series combination of switches 603 and 604, are coupled to voltage source 610 on the upper half of the H-bridge as shown in FIG. 6. These series combinations are coupled to a common voltage 690 through diodes 630 and 631, and are coupled to limiters 640 and 641, respectively. The series combination of switches 605 and 606, and the series combination of switches 607 and 608, are coupled to common voltage 690 on the lower half of the H-bridge as shown in FIG. 6. These series combinations are coupled to voltage sources 612 and 614 through diodes 632 and 633, and are coupled to limiters 642 and 643, respectively.

As will be evident to those skilled in the relevant art, pulse-width modulation is implemented by the control of switches 601–608. One aspect of this modulation is that each of the series combinations of switches be switched at the same time as the other switch (or switches) in the combination. That is, switch 601 should be switched at the same time as switch 602, switch 603 at the same time as switch 604, and so on. Rather than having two switches, any series combination could be of any other number of switches, depending on the voltages to be switched. In addition, it is typical that the combinations of switches 601 and 602 and of switches 607 and 608 be on or off in phase with each other and out of phase with the combinations of switches 603 and 604 and switches 605 and 606. Rapid switching times may be required, depending on the nature of the load and the desired implementation of pulse-width modulation. Voltage sources 610, 612 and 614 may be large in relation to common voltage 690 and thus the switches may need to stand off high voltages. Any one or more of these requirements may be met by using switching circuit 100 as described above. For example, switches 601 and 602 may be switches 340A and 340B of FIG. 3A, and they may be switched in opposite phase with switch 340C (representing switches 603 and 604).

Switching circuit 100, and other implementations of the present invention, may be used with many other devices and circuits, such as those employing pulse-width or pulse-frequency modulation. One example is the control of switches in a defibrillator that employs a switch-mode amplifier having a step-up converter and an optional step-down converter. As one illustration, U.S. patent application, Ser. No. 09/191,662, which is hereby incorporated herein by reference, describes a variable defibrillation waveform generator. The generator includes a switch-mode amplifier that has a step-down converter that selectively decreases the charge voltage of a rapid-discharge energy storage device. The step-down converter may include at least one buck switch that, in some implementations, is responsive to a pulse-width modulated control signal from a controller. The amplifier also may include a step-up converter that selectively amplifies the output of the step-down converter to generate an amplified voltage. The step-up converter has at least one boost switch that, in some implementations, is responsive to a pulse-width modulated control signal from the controller. The control signals to the step-down and step-up amplifiers may correspond to the primary control signals 112 of the present FIG. 1. Either or both of the buck and boost switches may correspond to switching devices 150 of the present invention. In addition, the defibrillation waveform generator may include a biphasic converter, such as an H-bridge, that may be implemented using switches switched by switching circuit 100, or another implementation, of the present invention.

Further features of the above-described apparatuses and methods are described in U.S. Patent Application entitled "METHOD AND APPARATUS FOR ASYMMETRICALLY INDUCING VOLTAGES IN TRANSFORMER SECONDARY WINDINGS WHILE AVOIDING SATURATION OF THE TRANSFORMER CORE," referred to above and hereby incorporated by reference herein.

Having now described various aspects of the present invention, it should be apparent to those skilled in the relevant art that the foregoing is illustrative only and not limiting, having been presented by way of example only. For instance, many other schemes for distributing functions among the various functional elements of the illustrated embodiment are possible in accordance with the present invention. The functions of any element may be carried out in various ways in alternative embodiments. Thus, numerous variations are contemplated in accordance with the present invention to generate control and driving signals, to detect "on" or "off" states, and so on.

In particular, there are many variations of circuit topologies and circuit elements that may carry out the functions described herein. Also, correspondences noted for illustrative purposes between elements of FIGS. 1 and 2 and elements of FIG. 3A are intended to be illustrative only and many other correspondences could be made. For example, for convenience of illustration driver 240 may be represented as being implemented by field-effect transistor 336A with respect to driving the switching device on, and by field-effect transistor 334A with respect to driving the switching device off. Resistor 338A also may be considered to be part of driver 240. However, in an alternative representation, transistor 336A could be considered to be part of on-threshold detector 220 and transistor 334A could be considered to be part of off-threshold detector 230. As another example, switching device 150A is described as being implemented by power transistor 340A. However, switching device 150A could be any of a variety of other devices or circuits.

The method steps and decision elements shown in FIG. 5 also are illustrative only. Steps and/or decision elements may be combined, separated, carried out in other orders or sequences, carried out in parallel, or otherwise rearranged in alternative embodiments. Also, additional steps and/or decision elements may be added in alternative embodiments. Numerous other embodiments, and modifications thereof, are contemplated as falling within the scope of the present invention as defined by appended claims and equivalents thereto.

What is claimed is:

1. A switching circuit, comprising:
   one or more switching devices;
   at least one control and driving signal provider constructed and arranged to provide one or more control and driving signals at one or more output ports; and
   one or more detector and driver circuits, each having an input coupled to an output port and an output coupled to at least one of the switching devices, each constructed and arranged to
      (a) detect when a control and driving signal present at the output port is in an on state and, responsive thereto, drive at least one of the switching devices on by applying to it the control and driving signal, and
      (b) detect when the control and driving signal is in an off state and, responsive thereto, drive at least one of the switching devices off by applying to it the control and driving signal,
   wherein the at least one control and driving signal provider comprises a transformer having primary and secondary sides wherein one or more input ports comprise one or more primary windings on the primary side and the one or more output ports,comprise one or more secondary windings on the secondary side,
   the input of a first detector and driver circuit is coupled to a first of the secondary windings, and
   a first control and driving signal comprises a voltage waveform across the first secondary winding.

2. The switching circuit of claim 1, wherein:
   the first detector and driver circuit comprises
      an on-threshold detector constructed and arranged to detect that the first control and driving signal is in the on state when its voltage reaches an on-threshold voltage.

3. The switching circuit of claim 2, wherein:
   the on-threshold detector comprises at least one voltage reference.

4. The switching circuit of claim 2, wherein:
   the first detector and driver circuit comprises
      an off-threshold detector constructed and arranged to detect that the first control and driving signal is in the off state when its voltage reaches an off-threshold voltage.

5. The switching circuit of claim 4, wherein:
   the on-threshold detector comprises a first voltage reference and the off-threshold detector comprises a second voltage reference.

6. The switching circuit of claim 5, wherein:
   the on-threshold and off-threshold voltages are of opposite polarities and the first and second voltage references are each coupled in parallel with the first secondary winding and in opposing polarities with respect to each other.

7. The switching circuit of claim 6, wherein:
   the first voltage reference comprises a first zener diode;
   the first detector and driver circuit further comprises a damping resistor having a first node coupled to a first node of the first secondary winding and having a second node coupled to the cathode of the first zener diode; and
   the on-threshold detector further comprises
      a first resistor having a first node coupled to the anode of the first zener diode and a second node coupled to the second node of the first secondary winding.

8. The switching circuit of claim 7, wherein:
   the second voltage reference comprises a second zener diode; and
   the off-threshold detector further comprises
      a second resistor having a first node coupled to the second node of the damping resistor and a second node coupled to the anode of the second zener diode, and further wherein the cathode of the second zener diode is coupled to the second node of the first secondary winding.

9. The switching circuit of claim 4, wherein:
   the first detector and driver circuit comprises
      a driver circuit constructed and arranged to drive a first of the one or more switching devices on responsive to the on-threshold detector detecting that the first control and driving signal is in the on state and to drive the first switching device off responsive to the off-threshold detector detecting that the first control and driving signal is in the off state.

10. The switching circuit of claim 9, wherein:
    the driver circuit comprises
       a first driving switch that is constructed and arranged to couple the first control and driving signal to the first switching device so as to turn the first switching device on when the on-threshold detector detects that the first control and driving signal is in the on state, and
       a second driving switch that is constructed and arranged to couple the first control and driving signal to the first switching device so as to turn the first switching device off when the off-threshold detector detects that the first control and driving signal is in the off state.

11. The switching circuit of claim 10, wherein:
    the first and second driving switches are field-effect transistors.

12. The switching circuit of claim 1, wherein:
    the input of a second detector and driver circuit is coupled to a second of the secondary windings;
    a second control and driving signal comprises a voltage waveform across the second secondary winding;
    the first detector and driver circuit is constructed and arranged to detect when the first control and driving signal is in an on state and, responsive thereto, apply the first control and driving signal to drive a first of the switching devices on;
    the second detector and driver circuit is constructed and arranged to detect when the second control and driving signal is in an on state and, responsive thereto, apply the second control and driving signal to drive a second of the switching devices on; and the first and second switching devices are turned on synchronously.

13. The switching circuit of claim 12, wherein:

the first and second detector and driver circuits are electrically isolated from each other.

14. The switching circuit of claim 12, wherein:

the first detector and driver circuit is constructed and arranged to detect when the first control and driving signal is in an off state and, responsive thereto, apply the first control and driving signal to drive the first switching device off;

the second detector and driver circuit is constructed and arranged to detect when the second control and driving signal is in an off state and, responsive thereto, apply the second control and driving signal to drive the second switching device off; and the first and second switching devices are turned on and off synchronously.

15. The switching circuit of claim 14, wherein:

the first and second switching devices are turned on and off synchronously in a same phase.

16. The switching circuit of claim 14, wherein:

the first and second switching devices are turned on and off synchronously in opposite phases.

17. The switching circuit of claim 14, wherein:

the first switching device has first and second output nodes;

the second switching device has first and second output nodes; and the second output node of the first switching device is coupled to the first output node of the second switching device.

18. The switching circuit of claim 17, wherein:

the first and second switching devices are insulated-gate bipolar transistors, the emitter of the first switching device is coupled to the collector of the second switching device, the first control and driving signal is applied to the gate of the first switching device, and the second control and driving signal is applied to the gate of the second switching device.

19. The switching circuit of claim 17, wherein:

the first and second switching devices are field-effect transistors, the source of the first switching device is coupled to the drain of the second switching device, the first control and driving signal is applied to the gate of the first switching device, and the second control and driving signal is applied to the gate of the second switching device.

20. The switching circuit of claim 9, further comprising:

a controller constructed and arranged to
 (a) apply to a first primary driven winding of the one or more primary windings a first set of voltages, thereby generating (i) a first current in the first primary driven winding, (ii) a first magnetic field having a first quantum of energy, and (iii) a magnetically induced second set of voltages in the first secondary winding,
 (b) interrupt the first current, thereby causing the first magnetic field to collapse, and
 (c) not later than interrupting the first current, clamp the first primary driven winding to a third set of voltages, thereby magnetically inducing a fourth set of voltages in the first secondary winding, wherein at least one of the fourth set of voltages is less than at least one of the second set of voltages;

wherein the first control and driving signal comprises the second and fourth sets of voltages.

21. The switching circuit of claim 20, wherein:

the controller further is constructed and arranged to clamp the first primary driven winding to the third set of voltages such that at least one of the fourth set of voltages is less than at least one of the second set of voltages by at least a predetermined amount.

22. The switching circuit of claim 20, wherein:

the controller further is constructed and arranged to clamp the first primary driven winding to the third set of voltages such that at least one of the fourth set of voltages is less than each of the second set of voltages.

23. The switching circuit of claim 20, wherein:

the controller further is constructed and arranged to clamp the first primary driven winding to the third set of voltages such that each of the fourth set of voltages is less than each of the second set of voltages.

24. The switching circuit of claim 20, wherein:

the on state of the first control and driving signal comprises one or more of the second set of voltages.

25. The switching circuit of claim 24, wherein:

the driver circuit drives the first switching device on when the on-threshold detector detects that the first control and driving signal comprises one or more of the second set of voltages.

26. The switching circuit of claim 25, wherein:

the first switching device remains on when the first control and driving signal comprises one or more of the fourth set of voltages.

27. The switching circuit of claim 20, wherein:

the controller further is constructed and arranged to
 (d) apply to a second primary driven winding a fifth set of voltages having polarities opposite to polarities of the first set of voltages, thereby generating (i) a third current in the second primary driven winding, (ii) a third magnetic field having a third quantum of energy, and (iii) a magnetically induced sixth set of voltages in the first secondary winding having polarities opposite to polarities of the second set of voltages,
 (e) interrupt the third current, thereby causing the third magnetic field to collapse, and
 (f) not later than interrupting the third current, clamp the second primary driven winding to a seventh set of voltages, thereby magnetically inducing an eighth set of voltages in the first secondary winding, wherein a magnitude of at least one of the eighth set of voltages is less than a magnitude of at least one of the sixth set of voltages;

wherein the first control and driving signal further comprises the sixth and eighth sets of voltages.

28. The switching circuit of claim 27, wherein:

the controller further is constructed and arranged to clamp the second primary driven winding to the seventh set of voltages such that a magnitude of at least one of the eighth set of voltages is less than a magnitude of at least one of the sixth set of voltages by at least a predetermined amount.

29. The switching circuit of claim 28, wherein:

the driver circuit drives the first switching device off when the off-threshold detector detects that the first control and driving signal comprises one or more of the sixth set of voltages.

30. The switching circuit of claim 29, wherein:

the first switching device remains off when the first control and driving signal comprises one or more of the eighth set of voltages.

31. The switching circuit of claim 27, wherein:

the on state of the first control and driving signal comprises one or more of the second set of voltages;

the off state of the first control and driving signal comprises one or more of the sixth set of voltages;

the on-threshold detector is constructed and arranged to detect that the first control and driving signal is in the on state when one or more of the second set of voltages reaches the on-threshold voltage; and the off-threshold detector is constructed and arranged to detect that the first control and driving signal is in the off state when one or more of the sixth set of voltages reaches the off-threshold voltage.

32. The switching circuit of claim 20, wherein:

the first set of voltages includes a voltage pulse having a substantially constant amplitude.

33. The switching circuit of claim 27, wherein:

the first set of voltages includes a voltage pulse having a substantially constant amplitude; and the fifth set of voltages includes a voltage pulse having a substantially constant amplitude and having opposite polarity to the voltage pulse of the first set of voltages.

34. The switching circuit of claim 20, wherein:

the one or more primary windings include a primary clamp winding; and the controller further is constructed and arranged to (a) apply the first set of voltages to the first primary driven winding from a voltage supply having an output and a return, thereby generating the first current in a first current path including from the output to the return, (b) provide, not later than interrupting the first current, a second current path for a second current from the return to the output through at least the primary clamp winding, wherein the second current generates a second magnetic field having substantially the first quantum of energy, and (c) maintain the second current path for a period of time such that the first quantum of energy is returned to the power supply.

35. The switching circuit of claim 34, wherein:

the controller further is constructed and arranged to (d) apply to a second primary driven winding a fifth set of voltages having polarities opposite to polarities of the first set of voltages; and the primary clamp winding includes the second primary driven winding.

36. The switching circuit of claim 35, wherein:

the primary clamp winding has a first number of turns, the first primary driven winding has a second number of turns, and the secondary winding has a third number of turns; and a first ratio between the first number and second number, and a second ratio between the first number and the third number, are determined so that a first voltage i magnetically coupled to the secondary winding by the first primary driven winding when the first magnetic field is generated is greater than a second voltage magnetically coupled to the secondary winding by the primary clamp winding when the second magnetic field is generated.

37. The switching circuit of claim 36, wherein:

the first voltage is greater than the second voltage by at least a predetermined amount.

38. A method for switching one or more switching devices comprising the steps of:

(a) detecting when a first control and driving signal is in an on state;

(b) responsive to step (a), driving at least one of the switching devices on by applying to it the first control and driving signal;

(c) detecting when the first control and driving signal is in an off state;

(d) responsive to step (c), driving at least one of the switching devices off by applying to it the first control and driving signal; and (e) prior to step (a), applying to a primary driven winding on the primary side of a transformer a first set of voltages, thereby generating (i) a first current in the primary driven winding, (ii) a first magnetic field having a first quantum of energy, and (iii) a magnetically induced second set of voltages in a first secondary winding on a secondary side of the transformer;

(f) prior to step (c), interrupting the first current, thereby causing the first magnetic field to collapse; and (g) not later than interrupting the first current and prior to step (c), clamping the primary driven winding to a third set of voltages, thereby magnetically inducing a fourth set of voltages in the first secondary winding, wherein at least one of the fourth set of voltages is less than at least one of the second set of voltages;

wherein the first control and driving signal comprises the second and fourth sets of voltages.

39. The method of claim 38, wherein:

step (g) includes the step of clamping the primary driven winding to the third set of voltages such that at least one of the fourth set of voltages is less than at least one of the second set of voltages by at least a predetermined amount.

40. The method of claim 38, wherein:

step (g) includes the step of clamping the primary driven winding to the third set of voltages such that at least one of the fourth set of voltages is less than each of the second set of voltages.

41. The method of claim 38, wherein:

step (g) includes the step of clamping the primary driven winding to the third set of voltages such that each of the fourth set of voltages is less than each of the second set of voltages.

42. The method of claim 38, wherein:

the on state of the first control and driving signal comprises one or more of the second set of voltages.

43. The method of claim 38, wherein:

the one or more primary windings include a primary clamp winding;

step (e) includes the step of applying the first set of voltages to the primary driven winding from a voltage supply having an output and a return, thereby generating the first current in a first current path including from the output to the return; and step (g) includes the steps of (i) providing a second current path for a second current from the return to the output through at least the primary clamp winding, wherein the second current generates a second magnetic field having substantially the first quantum of energy, and (ii) maintaining the second current path for a period of time such that the first quantum of energy is returned to the power supply.

44. The method of claim 43, wherein:

the primary clamp winding includes the primary driven winding.

45. The method of claim 44, wherein:

the primary clamp winding has a first number of turns, the primary driven winding has a second number of turns, and the secondary winding has a third number of turns; and a first ratio between the first number and second number, and a second ratio between the first number and the third number, are determined so that a first voltage magnetically coupled to the secondary winding by the primary driven winding when the first magnetic field is generated is greater than a second voltage magnetically coupled to the secondary winding by the primary clamp winding when the second magnetic field is generated.

46. The method of claim 45, wherein:

the first voltage is greater than the second voltage by at least a predetermined amount.

* * * * *